(12) United States Patent
Zhou et al.

(10) Patent No.: US 9,520,573 B2
(45) Date of Patent: Dec. 13, 2016

(54) DEVICE INCLUDING QUANTUM DOTS AND METHOD FOR MAKING SAME

(75) Inventors: Zhaoqun Zhou, Allston, MA (US); Peter T. Kazlas, Sudbury, MA (US); Benjamin S. Mashford, Essendon (AU)

(73) Assignee: QD VISION, INC., Lexington, MA (US)

( * ) Notice: Subject to any disclaimer, the term of this patent is extended or adjusted under 35 U.S.C. 154(b) by 0 days.

(21) Appl. No.: 13/422,683

(22) Filed: Mar. 16, 2012

(65) Prior Publication Data

US 2012/0292594 A1  Nov. 22, 2012

Related U.S. Application Data

(60) Provisional application No. 61/486,749, filed on May 16, 2011.

(51) Int. Cl.
*H01L 51/42* (2006.01)
*H01L 51/50* (2006.01)
(Continued)

(52) U.S. Cl.
CPC ......... *H01L 51/4233* (2013.01); *B82Y 30/00* (2013.01); *C09K 11/025* (2013.01); *C09K 11/565* (2013.01);
(Continued)

(58) Field of Classification Search
CPC .... H01L 52/4233; H01L 33/06; H01L 51/502; B82Y 30/00; H05B 33/14; C09K 11/025; C09K 11/565; Y02E 10/549
See application file for complete search history.

(56) References Cited

U.S. PATENT DOCUMENTS

| 5,532,486 A | 7/1996 | Stanchina et al. |
| 5,537,000 A | 7/1996 | Alivisatos et al. |

(Continued)

FOREIGN PATENT DOCUMENTS

| EP | 1843411 | 10/2007 |
| JP | A-2005-038634 | 2/2005 |

(Continued)

OTHER PUBLICATIONS

Yuh-Lang Lee, Yi-Siou Lo, "Highly Efficient Quantum-Dot-Sensitized Solar Cell Based on Co-Sensitization of CdS/CdSe", Advanced Functional Materials, Wiley-VCH Verlag GmbH & Co. vol. 19, 2009, pp. 604-609.*

(Continued)

*Primary Examiner* — William Coleman

(57) ABSTRACT

A device comprises an anode; a cathode; a layer therebetween comprising quantum dots; and a first layer comprising a material capable of transporting and injecting electrons in, or forming, contact with the cathode, the material comprising nanoparticles of an inorganic semiconductor material. In one embodiment of the device, quantum dots comprise a core comprising a first semiconductor material that confines holes better than electrons in the core and an outer shell comprising a second semiconductor material that is permeable to electrons. In another embodiment of the device, the nanoparticles comprise n-doped inorganic semiconductor material, and a second layer comprising a material capable of transporting electrons is disposed between the layer including quantum dots and the first layer, wherein the second layer has a lower electron conductivity than the first. In a further embodiment of the device, the first layer is UV treated. A method and other embodiments are also disclosed.

28 Claims, 6 Drawing Sheets

1. Maximum luminance efficiency reaches 20.1 cd/A at 2.5V
2. Maximum power luminous efficiency reaches 30.5 lm/W at 2V

(51) Int. Cl.

| | | |
|---|---|---|
| C09K 11/02 | (2006.01) | |
| C09K 11/56 | (2006.01) | |
| C09K 11/88 | (2006.01) | |
| H05B 33/14 | (2006.01) | |
| B82Y 30/00 | (2011.01) | |
| H01L 33/06 | (2010.01) | |

(52) U.S. Cl.
CPC ........... *C09K 11/883* (2013.01); *H01L 51/502* (2013.01); *H05B 33/14* (2013.01); *H01L 33/06* (2013.01); *H01L 2251/5369* (2013.01); *Y02E 10/549* (2013.01)

(56) References Cited

U.S. PATENT DOCUMENTS

| | | |
|---|---|---|
| 5,958,573 A | 9/1999 | Spitler et al. |
| 6,046,543 A | 4/2000 | Bulovic et al. |
| 6,111,274 A | 8/2000 | Arai |
| 6,322,901 B1 | 11/2001 | Bawendi et al. |
| 6,404,126 B1 | 6/2002 | Arai et al. |
| 7,160,613 B2 | 1/2007 | Bawendi et al. |
| 7,332,211 B1 | 2/2008 | Bulovic et al. |
| 7,442,320 B2* | 10/2008 | Lee .................. 252/62.3 E |
| 7,615,800 B2 | 11/2009 | Kahen |
| 7,700,200 B2 | 4/2010 | Bulovic et al. |
| 7,777,233 B2* | 8/2010 | Kahen .............. C09K 11/025 257/21 |
| 7,910,400 B2 | 3/2011 | Kwon et al. |
| 8,334,527 B2* | 12/2012 | Iizumi et al. ............... 257/40 |
| 8,368,048 B2 | 2/2013 | Locascio et al. |
| 8,563,143 B2 | 10/2013 | Park et al. |
| 9,054,329 B2* | 6/2015 | Coe-Sullivan et al. |
| 2001/0052752 A1 | 12/2001 | Ghosh et al. |
| 2003/0042850 A1 | 3/2003 | Bertram et al. |
| 2005/0006656 A1 | 1/2005 | Jain et al. |
| 2005/0230673 A1 | 10/2005 | Mueller et al. |
| 2005/0260440 A1 | 11/2005 | Seo et al. |
| 2006/0043361 A1 | 3/2006 | Lee et al. |
| 2006/0063029 A1 | 3/2006 | Jang et al. |
| 2006/0105200 A1 | 5/2006 | Poplavskyy et al. |
| 2006/0196375 A1 | 9/2006 | Coe-Sullivan et al. |
| 2006/0205142 A1 | 9/2006 | Ping et al. |
| 2007/0001581 A1 | 1/2007 | Stasiak et al. |
| 2007/0069202 A1 | 3/2007 | Choi et al. |
| 2007/0103068 A1 | 5/2007 | Bawendi et al. |
| 2007/0170446 A1 | 7/2007 | Cho et al. |
| 2007/0215856 A1 | 9/2007 | Kwon et al. |
| 2008/0001167 A1 | 1/2008 | Coe-Sullivan et al. |
| 2008/0203895 A1 | 8/2008 | Miller et al. |
| 2008/0204366 A1 | 8/2008 | Kane et al. |
| 2008/0217602 A1 | 9/2008 | Kahen et al. |
| 2008/0238829 A1 | 10/2008 | Kane et al. |
| 2009/0001385 A1* | 1/2009 | Skipor et al. ............... 257/79 |
| 2009/0039764 A1 | 2/2009 | Cho et al. |
| 2009/0066223 A1 | 3/2009 | Yabe et al. |
| 2009/0162011 A1 | 6/2009 | Coe-Sullivan et al. |
| 2009/0181478 A1 | 7/2009 | Cox et al. |
| 2009/0215208 A1 | 8/2009 | Coe-Sullivan et al. |
| 2009/0278141 A1 | 11/2009 | Coe-Sullivan et al. |
| 2009/0286338 A1* | 11/2009 | Coe-Sullivan et al. ........ 438/29 |
| 2010/0001256 A1 | 1/2010 | Coe-Sullivan et al. |
| 2010/0051901 A1 | 3/2010 | Kazlas et al. |
| 2010/0132770 A1 | 6/2010 | Beatty et al. |
| 2010/0283014 A1 | 11/2010 | Breen et al. |
| 2011/0095261 A1 | 4/2011 | Kazlas et al. |
| 2011/0103064 A1 | 5/2011 | Coe-Sullivan et al. |
| 2011/0245533 A1 | 10/2011 | Breen et al. |
| 2011/0284819 A1 | 11/2011 | Kang et al. |
| 2011/0287566 A1 | 11/2011 | Jang et al. |
| 2011/0291071 A1 | 12/2011 | Kim et al. |
| 2012/0138894 A1 | 6/2012 | Qian et al. |
| 2013/0009131 A1 | 1/2013 | Kazlas et al. |
| 2013/0037778 A1 | 2/2013 | Kazlas et al. |

FOREIGN PATENT DOCUMENTS

| | | |
|---|---|---|
| KR | 2010-0052926 | 5/2010 |
| WO | WO-9828767 A1 | 7/1998 |
| WO | WO-2007143197 A2 | 12/2007 |
| WO | WO-2008007124 A1 | 1/2008 |
| WO | WO-2009123763 A2 | 10/2009 |
| WO | WO-2009123763 A3 | 10/2009 |
| WO | WO-2011005859 A2 | 1/2011 |
| WO | WO-2012158252 A1 | 11/2012 |

OTHER PUBLICATIONS

R. Vogel, P. Hoyer, H. Weller, Quantum-Sized PbS, CdS, Ag2S, Sb2S2 and Bi2S3 Particles as Sensitizers for Various Nanoporous Wide-Bandgap Semiconductors, Journal of Physical Chemistry, vol. 98, American Chemical Society, 1994, pp. 3183-3188.*

V V Nikes and Shailaja Mahamuni, "Highly photoluminescent ZnSe/ZnS quantum dots", Semiconductor Science & Technology, vol. 16, Institute of Physics Publishing, 2001, pp. 685-690.*

Bae, W., et al., "Multicolored Light-Emitting Diodes Based on All-Quantum-Dot Multilayer Films Using Layer-by-Layer Assembly Method", Nano Lett., 2010, vol. 10, pp. 2368-2373.

Blochwitz, et al., "Interface Electronic Structure of Organic Semiconductors With Controlled Doping Levels", *Organic Electronics 2* (2001) 97-104.

Bulovic, V. et al. "Transparent light-emitting devices" *Nature* 1996, vol. 380, p. 29.

Carlson, et al., "Valence band alignment at cadmium selenide quantum dot and zinc oxide (10110) interfaces", *J. Phys. Chem. C* 112, pp. 8419-8423 (2008).

Caruge et al., "Colloidal quantum-dot light-emitting diodes with metal-oxide charge transport layers", 2008 *Nature Photonics* vol. 2, pp. 247-250.

Caruge, et al., "NiO as an inorganic hole-transporting layer in quantum-dot light-emitting devices", *Nano Lett*. 6, pp. 2991-2994 (2006).

Chan, C. et al., "Contact Potential Difference Measurements of Doped Organic Molecular Thin Films", *J. Vac. Sci. Technol.* A 22(4), Jul./Aug. 2004.

Cho, et al., "High-performance crosslinked colloidal quantum-dot light-emitting diodes", *Nature Photon* 3, pp. 341-345 (2009).

Coe-Sullivan, "Hybrid Organic/Quantum Dot Thin Film Structures and Devices", MIT Thesis in partial fulfillment of Ph.D. in Electrical Engineering and Computer Science (2005).

Dabbousi et al., "(CdSe)ZnS Core—Shell Quantum Dots: Synthesis and Characterization of a Size Series of Highly Luminescent Nanocrystallites", *J. Phys. Chem B*. 101, pp. 9463-9475 (1997).

Gu, G. et al. "Transparent organic light emitting devices" *Appl. Phys. Lett.* 1996, 68, pp. 2606-2608.

Huang, et al. "Bias-induced photoluminescence quenching of single colloidal quantum dots embedded in organic semiconductors", *Nano Letters* 2007, vol. 7, No. 12, pp. 3781-3786.

Jasieniak, et al., "Size-dependent valence and conduction band-edge energies of semiconductor nanocrystals", *ACS Nano* 5, pp. 5888-5902 (2011).

Kim; H-M, et al., "Semi-transparent quantum-dot light emitting diodes with an inverted structure", J. of Mater. Chem. C, 2014, 2, 2259.

Kwak, J. et al. "Bright and Efficient Full-Color Colloidal Quantum Dot Light-Emitting Diodes Using an Inverted Device Structure" *Nano Lett.*, 2012, 12 (5), pp. 2362-2366.

Kwak, J. et al. "Bright and Efficient Full-Color Colloidal Quantum Dot Light-Emitting Diodes Using an Inverted Device Structure" *Nano Lett.*, 2012, 12 (5), pp. 2362-2366. (Supporting Info.).

Kwon; S-J, et al., "Soft-chemistry Route to P-I-N Heterostructured Quantum Dot Electroluminescence Device: All Solution-Processed Polymer-Inorganic Hybrid QD-EL Device", *Mater. Res. Soc. Symp. Proc.* (2007) vol. 959.

Lee, C., et al., "Full-color light-emitting diodes based on colloidal quantum dots", *218th ECS Meeting*, Abstract #1590 (2010).

(56) References Cited

OTHER PUBLICATIONS

Lee, D., et al., "Demonstration of Full Color and White Quantum Dot Light-Emitting Diodes with a Simple Inverted Structure", undated, from internet.

Li, et al., "Surface states in the photoionization of high-quality CdSe core/shell nanocrystals", *ACS Nano* 3, pp. 1267-1273 (2009).

Mahler, et al., "Towards non-blinking colloidal quantum dots", *Nature Mater.* 7, pp. 659-664 (2008).

Mashford, et al., "All-inorganic quantum-dot light-emitting devices formed via low-cost, wet-chemical processing", *J. Mater. Chem. 20*, 167-172 (2010).

Mashford, et al., "High-efficiency quantum-dot light-emitting devices with enhanced charge injection", *Nature Photonics* 7, pp. 407-412 (2013).

Miller, et al., "Microstructural evolution of sol-gel derived ZnO thin films", *Thin Solid Films*, vol. 518 (2010), pp. 6792-6798.

Murray, C.B., et al., "Synthesis and Characterization of Monodisperse Nanocrystals and Close-Packed Nanocrystal Assemblies" Annu. Rev. Mater. Sci. 2000 30: 545-610.

Oertel, et al. "Photodetectors based on treated CdSe quantum-dot films", *Appl. Phys, Lett.* 2005, vol. 87, pp. 213505-1-213505-3.

Ohmori, et al., "Photovoltaic properties of phthalocyanine based p-n diode evaporated onto titanium dioxide", *Thin Solid Films* 2006, vol. 499, pp. 369-373.

PCT International Search Report and Written Opinion in International Application No. PCT/US2012/029464 of QD Vision, Inc., mailed Oct. 16, 2012.

Qian, L. et al. "Stable and efficient quantum-dot light-emitting diodes based on solution-processed multilayer structures", *Nature Photonics*, vol. 5, pp. 543-548 (2011).

Schlamp, M.G. et al., "Improved efficiencies in light emitting diodes made with CdSe(CdS) core/shell type nanocrystals and a semiconducting polymer", *J. Appl. Phys.*, vol. 82, No. 11, pp. 5837-5842, 1997.

Schmechel, R., "A theoretical approach to the hopping transport in p-doped zinc-phthalocyanine" 48, *Internationales Wissenschaftliches Kolloquium, Technische Universtaat Ilmenau*, Sep. 2003.

Steckel, et al. "Blue Luminescence from (CdS)ZnS Core-Shell Nanocrystals" *Angew. Chem. Int. Ed.*, 43: pp. 2154-2158.

Stouwdam, J.W. et al., "Red, green, and blue quantum dot LEDs with solution processable ZnO nanocrystal electron injection layers" 2008 *Journal of Materials Chemistry*, vol. 18 pp. 1889-1894, published online Mar. 5, 2008.

Talapin, et al., "Prospects of colloidal nanocrystals for electronic and optoelectronic applications" *Chem. Reviews*, 2010, vol. 110, pp. 389-458.

Tvrdy, et al., "Photoinduced electron transfer from semiconductor quantum dots to metal oxide nanoparticles", *Proc. Natl Acad. Sci. USA* 108, pp. 29-34 (2011).

Wei, S-H, et al., "Calculated natural band offsets of all II-VI and III-V semiconductors: Chemical trends and the role of cation $d$ orbitals", *Appl. Phys. Lett.* (1998) vol. 72, No. 16, pp. 2011-2013.

Wood, V. et al., "Selection of Metal Oxide Charge Transport Layers for Colloidal Quantum Dot LEDs", *ACS Nano*, 2009, 3 (11), pp. 3581-3586.

Wu, et al., "Charge-transfer processes in single CdSe/ZnS quantum dots with p-type NiO nanoparticles", Chem. Commun. 46, pp. 4390-4392 (2010).

Zyga, L. "Quantum dot LEDs get brighter, more efficient", http://phys.org/news/2012-04-quantum-dot-brighter-efficient.html, Apr. 20, 2012.

\* cited by examiner

1. CdS QLED has low turn-on voltage $V_t=1.4V$
2. Peak external quantum efficiency reaches 19.1% at 2.05V 1. Maximum luminance efficiency reaches 20.1 cd/A at 2.5V
2. Maximum power luminous efficiency reaches 30.5 lm/W at 2V The EL lifetime of CdS-shell device is over 100 hours at 500 nits as initial brightness.

DEVICE INCLUDING QUANTUM DOTS AND METHOD FOR MAKING SAME

CLAIM OF PRIORITY

This application claims priority to U.S. Provisional Patent Application No. 61/486,749 filed 16 May 2011, which is hereby incorporated herein by reference in its entirety.

FEDERALLY SPONSORED RESEARCH OR DEVELOPMENT

This invention was made with Government support under Cooperative Agreement Number W911NF-09-2-0049 awarded by the United States Army Research Laboratory. The Government has certain rights in the invention.

TECHNICAL FIELD OF THE INVENTION

The present invention relates to the technical field of devices including quantum dots.

SUMMARY OF THE INVENTION

In accordance with one aspect of the present invention, there is provided a device comprising a pair of electrodes comprising an anode and a cathode; a layer comprising quantum dots disposed between the electrodes, wherein at least a portion of the quantum dots comprise a core comprising a first semiconductor material and an outer shell surrounding the core, the shell comprising a second semiconductor material, wherein the first semiconductor material confines holes better than electrons in the core and the second semiconductor material is permeable to electrons; and a first layer comprising a material capable of transporting and injecting electrons, the material comprising nanoparticles of a first inorganic semiconductor material, the first layer being disposed between the layer comprising quantum dots and the cathode, wherein the first layer and the cathode form an ohmic contact during operation of the device.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV.

In certain embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

For example, the first semiconductor material can comprise CdSe and the second semiconductor material can comprise CdS.

In certain embodiments, the absolute value of the difference between $E_{conduction\ band\ edge}$ of the first inorganic semiconductor material included in the first layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

The first layer can comprise nanoparticles of a first inorganic semiconductor material capable of transporting and injecting electrons that is intrinsic (undoped) or n-doped. A mixture of intrinsic and n-doped materials may also be included in the first layer.

Optionally the first layer can be UV treated. In certain embodiments, a UV treated first layer can be preferred. In certain embodiments, UV treatment can comprise irradiating the layer with ultraviolet light. Such irradiation can be for a period of at least 30 seconds. In certain embodiments, such UV treatment can be carried out in nitrogen or other inert atmosphere or environment.

The device can further include a second layer comprising a material capable of transporting electrons comprising a second inorganic semiconductor material, the second layer being disposed between the first layer and the layer comprising quantum dots, wherein the first layer has a higher electron conductivity than the second layer.

In certain embodiments of a device including such second layer, the absolute value of the difference between $E_{conduction\ band\ edge}$ of the second inorganic semiconductor material included in the second layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

Optionally, the second inorganic semiconductor material included in the second layer can comprise inorganic semiconductor nanoparticles. In certain embodiments, use of a second semiconductor material comprising inorganic semiconductor nanoparticles can be preferred.

In a device including a second layer, the second layer can comprise a second inorganic semiconductor material that is intrinsic (or undoped). Alternatively, the second layer can comprise a second inorganic semiconductor material that is n-doped with an electron conductivity less than that of the first layer.

The cathode can comprise a nonmetal. An example of a preferred cathode comprises indium tin oxide (ITO). However other cathode materials including a metal may also be included and/or desirable.

In certain embodiments, the cathode can have a work function of at least 3.5 eV. Other work functions may be determined by the skilled artisan to be useful and/or desirable.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer is preferably closer to the anode.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

The device can have a peak internal quantum efficiency of the device of at least about 80%.

The device can have a peak external quantum efficiency of the device of at least about 14% when measured over the voltage range of 1 Volt to 10 Volts.

The device can have a peak external quantum efficiency of the device of at least about 18% when measured over the voltage range of 1 Volt to 10 Volts.

In certain embodiments, the device can have an external quantum efficiency of at least about 14% when measured at 2-3 Volts.

In certain embodiments, the device can have an external quantum efficiency of at least about 18% when measured at 2-3 Volts.

In accordance with another aspect of the present invention there is provided a device comprising a pair of electrodes comprising an anode and a cathode; a layer comprising quantum dots disposed between the electrodes; a first layer comprising a material capable of transporting and injecting electrons, the material comprising nanoparticles of an n-doped inorganic semiconductor material, the first layer being in contact with the cathode and positioned between the emissive layer and the cathode, and a second layer comprising a material capable of transporting electrons comprising an inorganic semiconductor material, the second layer being disposed between the emissive layer and the first layer, wherein the second layer has a lower electron conductivity than the first layer.

Optionally the first layer can be UV treated. In certain embodiments, a UV treated first layer can be preferred. In certain embodiments, UV treatment can comprise irradiating the layer with ultraviolet light. Such irradiation can be for a period of at least 30 seconds. In certain embodiments, such UV treatment can be carried out in nitrogen or other inert atmosphere or environment.

Optionally, the second inorganic semiconductor material included in the second layer can comprise inorganic semiconductor nanoparticles. In certain embodiments, use of a second semiconductor material comprising inorganic semiconductor nanoparticles can be preferred.

In certain embodiments, the absolute value of the difference between $E_{conduction\ band\ edge}$ of the inorganic semiconductor material included in the second layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

In certain embodiments, the first layer and the cathode form an ohmic contact during operation of the device.

The quantum dots may have a core structure or core-shell structure.

In certain embodiments, at least a portion of the quantum dots can comprise a core comprising a first semiconductor material and an outer shell surrounding the core, wherein the shell comprises a semiconductor material comprising a second semiconductor material, wherein the first semiconductor material confines holes better than electrons in the core and the second semiconductor material is permeable to electrons.

In certain embodiments, the second semiconductor material is more permeable to electrons than holes.

By being more permeable to electrons than holes, the second semiconductor material provides a lower barrier for electron tunneling than holes.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV. In certain of such embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

In one example, the first semiconductor material can comprise CdSe and the second semiconductor material can comprise CdS.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer is preferably closer to the anode.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

In accordance with one aspect of the present invention, there is provided a device comprising a pair of electrodes comprising an anode and a cathode; a layer comprising quantum dots disposed between the electrodes, wherein at least a portion of the quantum dots comprise a core comprising a first semiconductor material and an outer shell surrounding the core, the shell comprising a second semiconductor material; and a first layer comprising a material capable of transporting and injecting electrons, the material comprising nanoparticles of a first inorganic semiconductor material, the first layer being disposed between the layer comprising quantum dots and the cathode, wherein the first layer and the cathode form an ohmic contact during operation of the device, wherein the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV.

In certain embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

For example, the first semiconductor material can comprise CdSe and the second semiconductor material can comprise CdS.

In certain embodiments, the absolute value of the difference between $E_{conduction\ band\ edge}$ of the first inorganic semiconductor material included in the first layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

The first layer can comprise nanoparticles of a first inorganic semiconductor material capable of transporting and injecting electrons that is intrinsic (undoped) or n-doped. A mixture of intrinsic and n-doped materials may also be included in the first layer.

Optionally the first layer can be UV treated. In certain embodiments, a UV treated first layer can be preferred. In certain embodiments, UV treatment can comprise irradiating the layer with ultraviolet light. Such irradiation can be for a period of at least 30 seconds. In certain embodiments, such UV treatment can be carried out in nitrogen or other inert atmosphere or environment.

The device can further include a second layer comprising a material capable of transporting electrons comprising a second inorganic semiconductor material, the second layer being disposed between the first layer and the layer comprising quantum dots, wherein the first layer has a higher electron conductivity than the second layer.

In certain embodiments of a device including such second layer, the absolute value of the difference between $E_{conduction\ band\ edge}$ of the second inorganic semiconductor material included in the second layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

Optionally, the second inorganic semiconductor material included in the second layer can comprise inorganic semiconductor nanoparticles. In certain embodiments, use of a second semiconductor material comprising inorganic semiconductor nanoparticles can be preferred.

In a device including a second layer, the second layer can comprise a second inorganic semiconductor material that is intrinsic (or undoped). Alternatively, the second layer can comprise a second inorganic semiconductor material that is n-doped with an electron conductivity less than that of the first layer.

The cathode can comprise a nonmetal. An example of a preferred cathode comprises indium tin oxide (ITO). However other cathode materials including a metal may also be included and/or desirable.

In certain embodiments, the cathode can have a work function of at least 3.5 eV. Other work functions may be determined by the skilled artisan to be useful and/or desirable.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer is preferably closer to the anode.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

The device can have a peak internal quantum efficiency of the device of at least about 80%.

The device can have a peak external quantum efficiency of the device of at least about 14% when measured over the voltage range of 1 Volt to 10 Volts.

The device can have a peak external quantum efficiency of the device of at least about 18% when measured over the voltage range of 1 Volt to 10 Volts.

In certain embodiments, the device can have an external quantum efficiency of at least about 14% when measured at 2-3 Volts.

In certain embodiments, the device can have an external quantum efficiency of at least about 18% when measured at 2-3 Volts.

In accordance with another aspect of the present invention, there is provided a device comprising a pair of electrodes comprising an anode and a cathode; an layer comprising quantum dots disposed between the electrodes; and a UV treated first layer comprising a material capable of transporting and injecting electrons in contact with the cathode and positioned between the emissive layer and the cathode, the material capable of transporting and injecting electrons comprising an inorganic semiconductor material.

In certain embodiments, UV treatment can comprise irradiating the layer with ultraviolet light. Such irradiation can be for a period of at least 30 seconds.

In certain embodiments, UV treatment can be carried out in nitrogen or other inert atmosphere or environment.

In certain embodiments, the first layer and the cathode form an ohmic contact during operation of the device The material capable of transporting and injecting electrons can comprise nanoparticles of the inorganic semiconductor material.

In certain embodiments, the absolute value of the difference between $E_{conduction\ band\ edge}$ of the first inorganic semiconductor material included in the first layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

The first layer can comprise nanoparticles of a first inorganic semiconductor material capable of transporting and injecting electrons. Such material can be intrinsic (undoped) or n-doped. A mixture of intrinsic and n-doped materials may also be included in the first layer.

The device can further include a second layer comprising a material capable of transporting electrons comprising a second inorganic semiconductor material, the second layer being disposed between the first layer and the layer comprising quantum dots, wherein the first layer has a higher electron conductivity than the second layer.

Optionally, the second inorganic semiconductor material included in the second layer can comprise inorganic semiconductor nanoparticles. In certain embodiments, use of a second semiconductor material comprising inorganic semiconductor nanoparticles can be preferred.

In certain embodiments, the absolute value of the difference between $E_{conduction\ band\ edge}$ of the inorganic semiconductor material included in the second layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

The quantum dots may have a core structure or core-shell structure.

In certain embodiments, at least a portion of the quantum dots can comprise a core comprising a first semiconductor material and an outer shell surrounding the core, wherein the shell comprises a semiconductor material comprising a second semiconductor material wherein the first semiconductor material confines holes better than electrons in the core and the second semiconductor material is permeable to electrons.

In certain embodiments, the second semiconductor material is more permeable to electrons than holes.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV. In certain of such embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

In one example, the first semiconductor material can comprise CdSe and the second semiconductor material can comprise CdS.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer can be closer to the anode.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

In accordance with yet another aspect of the present invention, there is provided method of preparing a device comprising providing a first electrode; disposing an electron injection and transport layer comprising a first inorganic semiconductor over the electrode; treating the electron injection and transport layer with UV light; disposing a layer comprising quantum dots over the electron injection and transport layer; and disposing a second electrode over the hole transport layer.

In certain embodiments, UV treatment can comprise irradiating the layer with ultraviolet light. Such irradiation can be for a period of at least 30 seconds.

In certain embodiments, UV treatment can be carried out in nitrogen or other inert atmosphere or environment.

In certain embodiments, UV light with a 260 nm wavelength is used. Other UV wavelengths may also be determined by the skilled artisan to be desirable.

The electron injection and transport layer can comprise nanoparticles of the first inorganic semiconductor material.

Optionally the first inorganic semiconductor material can be n-doped. As discussed above, the level of doping can vary.

The method can further comprise disposing an electron transport layer over the UV treated electron injection and transport layer prior disposing the layer comprising quantum dots.

In certain embodiments including an electron transport layer, the electron transport layer comprises a second inorganic semiconductor material. In certain of such embodiments, the electron transport layer comprises nanoparticles of the inorganic semiconductor material.

Preferably, the electron conductivity of the electron transport layer is less than that of the electron injection and transport layer.

The second inorganic semiconductor material can be intrinsic (undoped) or doped, if doped, the doping level can vary as discussed above.

The method can further comprise disposing a material capable of transporting holes over layer comprising quantum dots prior to disposing the second electrode.

The method can further comprise disposing a hole injection layer prior to disposing the second electrode.

In certain embodiments, the device that is prepared can comprise a light-emitting device wherein a layer comprising quantum dots is a light emissive layer.

In certain embodiments, the device that is prepared can comprise a photovoltaic device wherein a layer comprising quantum dots is a light absorbing layer.

In accordance with another aspect of the present invention, there is provided a device including a layer comprising quantum dots, the device having a peak internal quantum efficiency of the device of at least about 80%.

In certain embodiments, the device can comprise a light-emitting device wherein a layer comprising quantum dots is a light emissive layer.

In certain embodiments, the device can comprise a photovoltaic device wherein a layer comprising quantum dots is a light absorbing layer.

In accordance with another aspect of the present invention, there is provided a device including a layer comprising quantum dots, the device having a peak external quantum efficiency of the device of at least about 18% when measured over the voltage range of 1 Volt to 10 Volts.

In certain embodiments, the device comprises a light-emitting device, wherein a layer comprising quantum dots is an emissive layer.

In certain embodiments, the device comprises a photovoltaic device wherein a layer comprising quantum dots is a light absorbing layer.

In certain embodiments, the device can have an external quantum efficiency of at least about 18% when measured at 2-3 Volts.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed.

Other embodiments will be apparent to those skilled in the art from consideration of the description and drawings, from the claims, and from practice of the invention disclosed herein.

Figure 1:
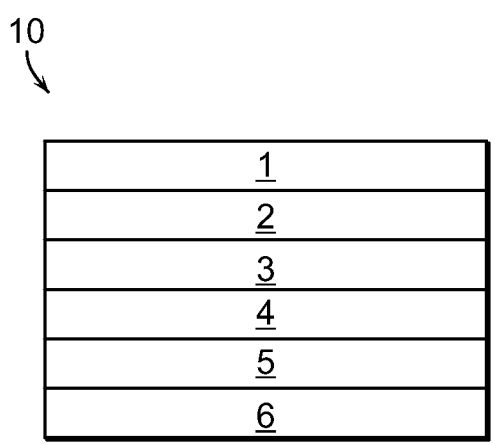
FIG. 1 is schematic drawing depicting an example of an embodiment of a light-emitting device structure that can be made or processed in accordance with the invention.
Figure 2:
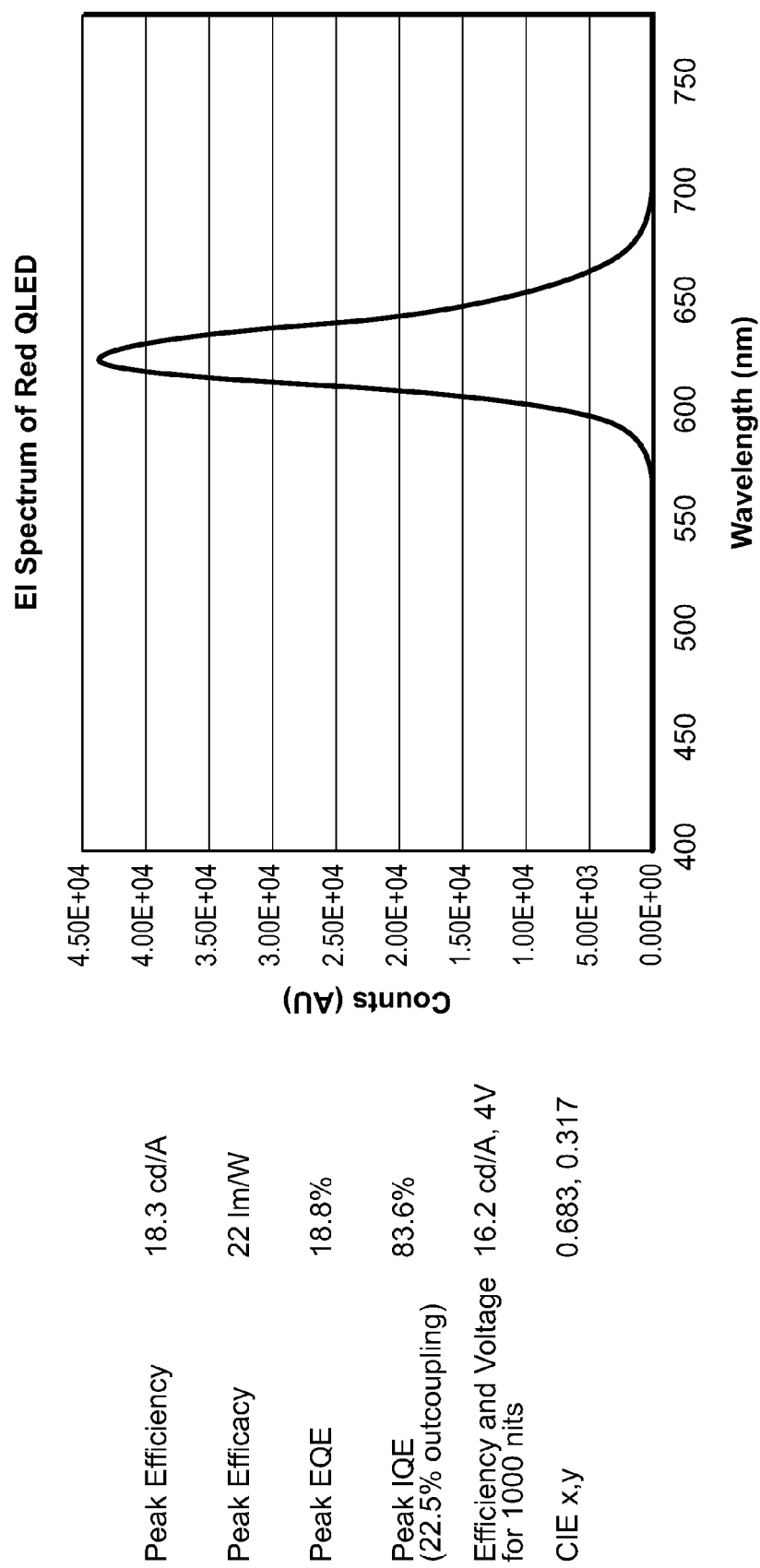
FIG. 2 provides an example of an electroluminescent spectrum of an example of an embodiment of a light emitting device in accordance with one aspect the invention and related device data.

The attached figure is a simplified representation presented for purposes of illustration only; actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

In accordance with one aspect of the present invention, there is provided a device comprising a pair of electrodes comprising an anode and a cathode; a layer comprising quantum dots disposed between the electrodes, wherein at least a portion of the quantum dots comprise a core comprising a first semiconductor material and an outer shell surrounding the core, the shell comprising a second semiconductor material, wherein the first semiconductor material confines holes better than electrons in the core and the second semiconductor material is permeable to electrons; and a first layer comprising a material capable of transporting and injecting electrons, the material comprising nanoparticles of a first inorganic semiconductor material, the first layer being disposed between the layer comprising quantum dots and the cathode, wherein the first layer and the cathode form an ohmic contact during operation of the device.

In certain embodiments, the second semiconductor material is more permeable to electrons than holes.

By being more permeable to electrons than holes, the second semiconductor material provides a lower barrier for electron tunneling than holes.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV. In certain of such embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

For example, the first semiconductor material can comprise CdSe and the second semiconductor material can comprise CdS.

In certain embodiments, the absolute value of the difference between $E_{conduction\ band\ edge}$ of the first inorganic semiconductor material included in the first layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

The first layer can comprise nanoparticles of a first inorganic semiconductor material capable of transporting and injecting electrons that is intrinsic (undoped) or n-doped. A mixture of intrinsic and n-doped materials may also be included in the first layer.

Examples of preferred inorganic semiconductor materials for inclusion in the first layer include, but are not limited to, zinc oxide, titanium oxide, and mixtures thereof, In certain embodiments, nanoparticles of a first inorganic semiconductor material can have an average particle size less than 20 nm. For example, the average particle size can be less than 10 nm, less than 5 nm, less than 4 nm, less than 2 nm. In certain embodiments, the nanoparticles can have an average particle size in a range from about 2 to about 6 nm. Other sizes may also be determined by the skilled art to be useful and/or desirable. In certain embodiments, a uniform or substantially uniform nanoparticle size may be desirable. In certain embodiments, a nonuniform nanoparticle size may be desirable.

As the skilled artisan will appreciate, the level of doping can vary. Factors that can influence the doping level include, but are not limited to quantum dot size, quantum dot composition, the amount of quantum dots, the thickness of layers including quantum dots, other materials present in the device, the thickness of layers including any such other layers, and the excitation level.

Optionally the first layer can be UV treated. In certain embodiments, a UV treated first layer can be preferred. In certain embodiments, UV treatment can comprise irradiating the layer with ultraviolet light. Such irradiation can be for a period of at least 30 seconds. In certain embodiments, such UV treatment can be carried out in nitrogen or other inert atmosphere or environment.

The device can further include a second layer comprising a material capable of transporting electrons comprising a second inorganic semiconductor material, the second layer being disposed between the first layer and the layer comprising quantum dots, wherein the first layer has a higher electron conductivity than the second layer.

In certain embodiments of a device including such second layer, the absolute value of the difference between $E_{conduction\ band\ edge}$ of the second inorganic semiconductor material included in the second layer and $E_{LUMO}$ of the quantum dots is no greater than 0.5 eV measured relative to vacuum level with an energy level eV. For example, in certain of such embodiments, the absolute value of the difference is no greater than 0.3 eV, no greater than 0.2 eV, no greater than 0.1 eV, or can be zero.

Optionally, the second inorganic semiconductor material included in the second layer can comprise inorganic semiconductor nanoparticles. In certain embodiments, use of a second semiconductor material comprising inorganic semiconductor nanoparticles can be preferred.

In a device including a second layer, the second layer can comprise a second inorganic semiconductor material that is intrinsic (or undoped). Alternatively, the second layer can comprise a second inorganic semiconductor material that is n-doped with an electron conductivity less than that of the first layer.

As discussed above, if doped, the level of doping can vary.

The cathode can comprise a nonmetal. An example of a preferred cathode comprises indium tin oxide (ITO). However other cathode materials including a metal may also be included and/or desirable.

In certain embodiments, the cathode can have a work function of at least 3.5 eV. Other work functions may be determined by the skilled artisan to be useful and/or desirable.

In certain embodiments, the absolute value of the difference between $E_{LUMO}$ of the quantum dots and the Work function of the Cathode is less than 0.5 eV. In certain embodiments, the absolute value of the difference between $E_{LUMO}$ of the quantum dots and the Work function of the Cathode is less than 0.3 eV. In certain embodiments, the absolute value of the difference between $E_{LUMO}$ of the quantum dots and the Work function of the Cathode is less than 0.2 eV.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer is preferably closer to the anode.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

The device can have a peak internal quantum efficiency of the device of at least about 80%.

The device can have a peak external quantum efficiency of the device of at least about 14% when measured over the voltage range of 1 Volt to 10 Volts.

The device can have a peak external quantum efficiency of the device of at least about 18% when measured over the voltage range of 1 Volt to 10 Volts.

In certain embodiments, the device can have an external quantum efficiency of at least about 14% when measured at 2-3 Volts.

In certain embodiments, the device can have an external quantum efficiency of at least about 18% when measured at 2-3 Volts.

Other information and techniques described herein and/or incorporated herein by reference can also be useful with this aspect of the present invention.

In accordance with one aspect of the present invention, there is provided a device comprising a pair of electrodes comprising an anode and a cathode; a layer comprising quantum dots disposed between the electrodes, wherein at least a portion of the quantum dots comprise a core comprising a first semiconductor material and an outer shell surrounding the core, the shell comprising a second semiconductor material; and a first layer comprising a material capable of transporting and injecting electrons, the material comprising nanoparticles of a first inorganic semiconductor material, the first layer being disposed between the layer comprising quantum dots and the cathode, wherein the first layer and the cathode form an ohmic contact during operation of the device, wherein the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV.

In certain embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

For example, the first semiconductor material can comprise CdSe and the second semiconductor material can comprise CdS.

In certain embodiments, the absolute value of the difference between $E_{conduction\ band\ edge}$ of the first inorganic semiconductor material included in the first layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

The first layer can comprise nanoparticles of a first inorganic semiconductor material capable of transporting and injecting electrons that is intrinsic (undoped) or n-doped. A mixture of intrinsic and n-doped materials may also be included in the first layer.

Optionally the first layer can be UV treated. In certain embodiments, a UV treated first layer can be preferred. In certain embodiments, UV treatment can comprise irradiating the layer with ultraviolet light. Such irradiation can be for a period of at least 30 seconds. In certain embodiments, such UV treatment can be carried out in nitrogen or other inert atmosphere or environment.

The device can further include a second layer comprising a material capable of transporting electrons comprising a second inorganic semiconductor material, the second layer being disposed between the first layer and the layer comprising quantum dots, wherein the first layer has a higher electron conductivity than the second layer.

In certain embodiments of a device including such second layer, the absolute value of the difference between $E_{conduction\ band\ edge}$ of the second inorganic semiconductor material included in the second layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

Optionally, the second inorganic semiconductor material included in the second layer can comprise inorganic semiconductor nanoparticles. In certain embodiments, use of a second semiconductor material comprising inorganic semiconductor nanoparticles can be preferred.

In a device including a second layer, the second layer can comprise a second inorganic semiconductor material that is intrinsic (or undoped). Alternatively, the second layer can comprise a second inorganic semiconductor material that is n-doped with an electron conductivity less than that of the first layer.

The cathode can comprise a nonmetal. An example of a preferred cathode comprises indium tin oxide (ITO). However other cathode materials including a metal may also be included and/or desirable.

In certain embodiments, the cathode can have a work function of at least 3.5 eV. Other work functions may be determined by the skilled artisan to be useful and/or desirable.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer is preferably closer to the anode.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

The device can have a peak internal quantum efficiency of the device of at least about 80%.

The device can have a peak external quantum efficiency of the device of at least about 14% when measured over the voltage range of 1 Volt to 10 Volts.

The device can have a peak external quantum efficiency of the device of at least about 18% when measured over the voltage range of 1 Volt to 10 Volts.

In certain embodiments, the device can have an external quantum efficiency of at least about 14% when measured at 2-3 Volts.

In certain embodiments, the device can have an external quantum efficiency of at least about 18% when measured at 2-3 Volts.

Other information and techniques described herein and/or incorporated herein by reference can also be useful with this aspect of the present invention.

In accordance with another aspect of the present invention there is provided a device comprising a pair of electrodes comprising an anode and a cathode; a layer comprising quantum dots disposed between the electrodes; a first layer comprising a material capable of transporting and injecting electrons, the material comprising nanoparticles of an n-doped inorganic semiconductor material, the first layer being in contact with the cathode and positioned between the emissive layer and the cathode, and a second layer comprising a material capable of transporting electrons comprising an inorganic semiconductor material, the second layer being disposed between the emissive layer and the first layer, wherein the second layer has a lower electron conductivity than the first layer.

Optionally the first layer can be UV treated. In certain embodiments, a UV treated first layer can be preferred. In certain embodiments, UV treatment can comprise irradiating the layer with ultraviolet light. Such irradiation can be for a period of at least 30 seconds. In certain embodiments, such UV treatment can be carried out in nitrogen or other inert atmosphere or environment.

Optionally, the second inorganic semiconductor material included in the second layer can comprise inorganic semiconductor nanoparticles. In certain embodiments, use of a second semiconductor material comprising inorganic semiconductor nanoparticles can be preferred.

In certain embodiments, the absolute value of the difference between $E_{conduction\ band\ edge}$ of the inorganic semiconductor material included in the second layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

In certain embodiments, the first layer and the cathode form an ohmic contact during operation of the device.

The quantum dots may have a core structure or core-shell structure.

In certain preferred embodiments, at least a portion of the quantum dots can comprise a core comprising a first semiconductor material and an outer shell surrounding the core, wherein the shell comprises a semiconductor material comprising a second semiconductor material, wherein the first semiconductor material confines holes better than electrons in the core and the second semiconductor material is permeable to electrons.

In certain embodiments, the second semiconductor material is more permeable to electrons than holes.

By being more permeable to electrons than holes, the second semiconductor material provides a lower barrier for electron tunneling than holes.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV. In certain of such embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

In one example, the first semiconductor material can comprise CdSe and the second semiconductor material can comprise CdS.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer is preferably closer to the anode.

The cathode can comprise a nonmetal. An example of a preferred cathode comprises indium tin oxide (ITO). However other cathode materials including a metal may also be included and/or desirable.

In certain embodiments, the cathode can have a work function of at least 3.5 eV. Other work functions may be determined by the skilled artisan to be useful and/or desirable.

In certain embodiments, the absolute value of the difference between $E_{LUMO}$ of the quantum dots and the Work function of the Cathode is less than 0.5 eV. In certain embodiments, the absolute value of the difference between $E_{LUMO}$ of the quantum dots and the Work function of the Cathode is less than 0.3 eV. In certain embodiments, the absolute value of the difference between $E_{LUMO}$ of the quantum dots and the Work function of the Cathode is less than 0.2 eV.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

In certain embodiments, the device can have a peak external quantum efficiency of the device of at least about 14% when measured over the voltage range of 1 Volt to 10 Volts.

In certain embodiments, the device can have a peak external quantum efficiency of the device of at least about 18% when measured over the voltage range of 1 Volt to 10 Volts.

In certain embodiments, the device can have an external quantum efficiency of at least about 14% when measured at 2-3 Volts.

In certain embodiments, the device can have an external quantum efficiency of at least about 18% when measured at 2-3 Volts.

Other information and techniques described herein and/or incorporated herein by reference can also be useful with this aspect of the present invention.

In accordance with another aspect of the present invention, there is provided a device comprising a pair of electrodes comprising an anode and a cathode; an layer comprising quantum dots disposed between the electrodes; and a UV treated first layer comprising a material capable of transporting and injecting electrons in contact with the cathode and positioned between the emissive layer and the cathode, the material capable of transporting and injecting electrons comprising an inorganic semiconductor material.

In certain embodiments, UV treatment can be carried out in nitrogen or other inert atmosphere or environment.

In certain embodiments, the first layer and the cathode form an ohmic contact during operation of the device The material capable of transporting and injecting electrons can comprise nanoparticles of the inorganic semiconductor material.

In certain embodiments, the absolute value of the difference between $E_{conduction\ band\ edge}$ of the first inorganic semiconductor material included in the first layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

The first layer can comprise nanoparticles of a first inorganic semiconductor material capable of transporting and injecting electrons. Such material can be intrinsic (undoped) or n-doped. A mixture of intrinsic and n-doped materials may also be included in the first layer.

The device can further include a second layer comprising a material capable of transporting electrons comprising a second inorganic semiconductor material, the second layer being disposed between the first layer and the layer comprising quantum dots, wherein the first layer has a higher electron conductivity than the second layer.

Optionally, the second inorganic semiconductor material included in the second layer can comprise inorganic semiconductor nanoparticles. In certain embodiments, use of a second semiconductor material comprising inorganic semiconductor nanoparticles can be preferred.

In certain embodiments, the absolute value of the difference between $E_{conduction\ band\ edge}$ of the inorganic semiconductor material included in the second layer and $E_{LUMO}$ of the quantum dots is no greater than 0.5 eV measured relative to vacuum level with an energy level=0 eV. For example, in certain of such embodiments, the absolute value of the difference is no greater than 0.3 eV, no greater than 0.2 eV, no greater than 0.1 eV, or can be zero.

In certain embodiments, the first layer and the cathode form an ohmic contact during operation of the device.

The cathode can comprise a nonmetal. An example of a preferred cathode comprises indium tin oxide (ITO). However other cathode materials including a metal may also be included and/or desirable.

In certain embodiments, the cathode can have a work function of at least 3.5 eV. Other work functions may be determined by the skilled artisan to be useful and/or desirable.

In certain embodiments, the absolute value of the difference between $E_{LUMO}$ of the quantum dots and the Work function of the Cathode is less than 0.5 eV. In certain embodiments, the absolute value of the difference between $E_{LUMO}$ of the quantum dots and the Work function of the Cathode is less than 0.3 eV. In certain embodiments, the absolute value of the difference between $E_{LUMO}$ of the quantum dots and the Work function of the Cathode is less than 0.2 eV.

The quantum dots may have a core structure or core-shell structure.

In certain embodiments, at least a portion of the quantum dots can comprise a core comprising a first semiconductor material and an outer shell surrounding the core, wherein the shell comprises a semiconductor material comprising a second semiconductor material, wherein the first semiconductor material confines holes better than electrons in the core and the second semiconductor material is permeable to electrons.

In certain embodiments, the second semiconductor material is more permeable to electrons than holes.

By being more permeable to electrons than holes, the second semiconductor material provides a lower barrier for electron tunneling than holes.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV. In certain of such embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

In one example, the first semiconductor material can comprise CdSe and the second semiconductor material can comprise CdS.

The device can further include a layer comprising a material capable of transporting holes disposed between the layer comprising quantum dots and the anode.

The device can further include a hole injection layer between the layer comprising quantum dots and the anode.

In a device further including a layer comprising a material capable of transporting holes disposed and a hole injection layer between the layer comprising quantum dots and the anode, the hole injection layer can be closer to the anode.

The device can further be encapsulated.

In certain embodiments, a device can comprise a light-emitting device wherein a layer comprising quantum dots is a light emissive layer.

In certain embodiments, a device can comprise a photovoltaic device wherein a layer comprising quantum dots is a light absorbing layer.

In certain embodiments, the device can have a peak external quantum efficiency of the device of at least about 14% when measured over the voltage range of 1 Volt to 10 Volts.

In certain embodiments, the device can have a peak external quantum efficiency of the device of at least about 18% when measured over the voltage range of 1 Volt to 10 Volts.

In certain embodiments, the device can have an external quantum efficiency of at least about 14% when measured at 2-3 Volts.

In certain embodiments, the device can have an external quantum efficiency of at least about 18% when measured at 2-3 Volts.

Other information and techniques described herein and/or incorporated herein by reference can also be useful with this aspect of the present invention.

In accordance with yet another aspect of the present invention, there is provided a method of preparing a device comprising providing a first electrode; disposing an electron injection and transport layer comprising a first inorganic semiconductor over the electrode; treating the electron injection and transport layer with UV light; disposing a layer comprising quantum dots over the electron injection and transport layer; and disposing a second electrode over the hole transport layer.

In certain embodiments, UV treatment can comprise irradiating the layer with ultraviolet light. Such irradiation can be for a period of at least 30 seconds.

In certain embodiments, UV treatment can be carried out in nitrogen or other inert atmosphere or environment. The electron injection and transport layer can comprise nanoparticles of the first inorganic semiconductor material.

Optionally the first inorganic semiconductor material can be n-doped. As discussed above, the level of doping can vary.

The method can further comprise disposing an electron transport layer over the UV treated electron injection and transport layer prior disposing the layer comprising quantum dots.

In certain embodiments including an electron transport layer, the electron transport layer comprises a second inorganic semiconductor material. In certain of such embodiments, the electron transport layer comprises nanoparticles of the inorganic semiconductor material.

Preferably, the electron conductivity of the electron transport layer is less than that of the electron injection and transport layer.

The second inorganic semiconductor material can be intrinsic (undoped) or doped, if doped, the doping level can vary as discussed above.

The method can further comprise disposing a material capable of transporting holes over layer comprising quantum dots prior to disposing the second electrode.

The method can further comprise disposing a hole injection layer prior to disposing the second electrode.

The cathode can comprise a nonmetal. An example of a preferred cathode comprises indium tin oxide (ITO). However other cathode materials including a metal may also be included and/or desirable.

In certain embodiments, the cathode can have a work function of at least 3.5 eV. Other work functions may be determined by the skilled artisan to be useful and/or desirable.

In certain embodiments, the absolute value of the difference between $E_{LUMO}$ of the quantum dots and the Work function of the Cathode is less than 0.5 eV. In certain embodiments, the absolute value of the difference between $E_{LUMO}$ of the quantum dots and the Work function of the Cathode is less than 0.3 eV. In certain embodiments, the absolute value of the difference between $E_{LUMO}$ of the quantum dots and the Work function of the Cathode is less than 0.2 eV.

Other information and techniques described herein and/or incorporated herein by reference can also be useful with this aspect of the present invention.

In accordance with another aspect of the present invention, there is provided a device including a layer comprising quantum dots, the device having a peak internal quantum efficiency of the device of at least about 80%.

In certain embodiments, the device can comprise a light-emitting device wherein a layer comprising quantum dots is a light emissive layer.

In certain embodiments, the device can comprise a photovoltaic device wherein a layer comprising quantum dots is a light absorbing layer.

Other information and techniques described herein and/or incorporated herein by reference can also be useful with this aspect of the present invention.

In accordance with another aspect of the present invention, there is provided a device including a layer comprising quantum dots, the device having a peak external quantum efficiency of the device of at least about 18% when measured over the voltage range of 1 Volt to 10 Volts.

In certain embodiments, the device can have an external quantum efficiency of at least about 18% when measured at 2-3 Volts.

In certain embodiments, the device can comprise a light-emitting device wherein a layer comprising quantum dots is a light emissive layer.

In certain embodiments, the device can comprise a photovoltaic device wherein a layer comprising quantum dots is a light absorbing layer.

Other information and techniques described herein and/or incorporated herein by reference can also be useful with this aspect of the present invention.

FIG. 1 provides a schematic representation of an example of the architecture of a device according to one embodiment of the present invention. Referring to FIG. 1, the device 10 includes (from top to bottom) an anode 1, a layer comprising a hole injection material 2, a layer comprising a material capable of transporting holes (also referred to herein as a "hole transport layer") 3, a layer including quantum dots 4, a layer comprising a material capable of transporting and injecting electrons (also referred to herein as an "electron injection and transport layer") comprising a nanoparticles of an inorganic semiconductor material 5, a cathode 6, and a substrate (not shown).

In an embodiment of the depicted device comprising a light-emitting device, when voltage is applied across the anode and cathode, the anode injects holes into the hole injection material while the cathode injects electrons into the electron injection and transport layer. The injected holes and injected electrons combine to form an exciton on the quantum dot and emit light.

The substrate (not shown) can be opaque or transparent. A transparent substrate can be used, for example, in the manufacture of a transparent light emitting device. See, for example, Bulovic, V. et al., Nature 1996, 380, 29; and Gu, G. et al., Appl. Phys. Lett. 1996, 68, 2606-2608, each of which is incorporated by reference in its entirety. The substrate can be rigid or flexible. The substrate can be plastic, metal, semiconductor wafer, or glass. The substrate can be a substrate commonly used in the art. Preferably the substrate has a smooth surface. A substrate surface free of defects is particularly desirable.

The cathode 6 can be formed on the substrate (not shown). In certain embodiments, a cathode can comprise ITO, aluminum, silver, gold, etc. The cathode preferably comprises a material with a work function chosen with regard to the quantum dots included in the device. In certain embodiments, the absolute value of the difference between $E_{LUMO}$ of the quantum dots and the work function of the cathode is less than about 0.5 eV. In certain embodiments the absolute value of the difference between $E_{LUMO}$ of the quantum dots and the work function of the cathode is less than about 0.3 eV, and preferably less than about 0.2 eV. $E_{LUMO}$ of the quantum dots represents the energy level of the lowest unoccupied molecular orbital (LUMO) of the quantum dot. For example, a cathode comprising indium tin oxide (ITO) can be preferred.

Substrates including patterned ITO are commercially available and can be used in making a device according to the present invention.

The layer comprising a material capable of transporting and injection electrons 5 can comprise nanoparticles of a first inorganic semiconductor material capable of transporting and injecting electrons. Preferred inorganic semiconductor materials include those having a band gap that is greater than the emission energy of the quantum dots.

In certain embodiments, the absolute value of the difference between $E_{LUMO}$ of the quantum dots and $E_{conduction\ band\ edge}$ of material capable of transporting and injecting electrons can be less than about 0.5 eV. In certain embodiments, the absolute value of the difference between $E_{LUMO}$ of the quantum dots and $E_{conduction\ band\ edge}$ of the material capable of transporting and injecting electrons, can be less than about 0.3 eV, less than about 0.2 eV, less than about 0.1 eV, can be about zero. $E_{LUMO}$ of the quantum dots represents the energy level of the lowest unoccupied molecular orbital (LUMO) of the quantum dots; $E_{conduction\ band\ edge}$ of the material capable of transporting and injecting electrons represents the energy level of the conduction band edge of the material capable of transporting and injecting electrons.

Examples of inorganic semiconductor materials include a metal chalcogenide, a metal pnictide, or elemental semiconductor, such as a metal oxide, a metal sulfide, a metal selenide, a metal telluride, a metal nitride, a metal phosphide, a metal arsenide, or metal arsenide. For example, an inorganic semiconductor material can include, without limitation, zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, barium titanate, barium zirconate, zirconium silicate, yttria, silicon nitride, and a mixture of two or more thereof.

In certain embodiments, the inorganic semiconductor material can include a dopant.

Examples of preferred n-dopants for use in an inorganic semiconductor material taught herein include, but are not limited to, indium, aluminum, and gallium. As the skilled artisan will recognize other n-dopants can also be used.

In certain embodiments, a layer comprising nanoparticles of an inorganic material can be prepared by forming a layer from a dispersion of the nanoparticles in a liquid and removing the liquid. The liquid can be removed by evaporation, heat, or other technique identified by the skilled artisan. A preferred liquid is one in which the nanoparticles are not altered so as to change the composition or size thereof in a way that is not intended or desired.

As discussed herein, in certain embodiments, an electron injection and transport material and an electron transport material can include an n-type dopant.

In certain embodiments of the devices and methods described herein that include nanoparticles of an inorganic semiconductor in an electron injection and transport material and/or an electron transport material, nanoparticles can have an average particle size less than 20 nm. For example, the average particle size can be less than 10 nm, less than 5 nm, less than 4 nm, less than 2 nm. In certain embodiments, the nanoparticles can have an average particle size in a range from about 2 to about 6 nm. Other sizes may also be determined by the skilled art to be useful and/or desirable. In certain embodiments, a uniform or substantially uniform nanoparticle size may be desirable. In certain embodiments, a nonuniform nanoparticle size may be desirable.

An example of a preferred inorganic semiconductor material for inclusion in an electron injection and transport layer is zinc oxide. In certain embodiments, zinc oxide can be mixed or blended with one or more other inorganic materials, e.g., inorganic semiconductor materials, such as titanium oxide.

As mentioned above, in certain preferred embodiments, a layer comprising a material capable of transporting and injecting electrons can comprise nanoparticles of zinc oxide.

Zinc oxide nanoparticles can be prepared by known techniques. For example, zinc oxide nanoparticles can be prepared by a colloidal solution process.

In certain embodiments, the zinc oxide can be chemically modified. Examples of chemical modification include treatment with hydrogen peroxide.

In other embodiments, a layer comprising a material capable of transporting and injecting electrons can comprise a mixture including zinc oxide nanoparticles and titanium oxide nanoparticles.

The electron injection and transport material is preferably included in the device as a layer. In certain embodiments, the layer has a thickness in a range from about 10 nm to 500 nm.

Electron transport materials comprising an inorganic semiconductor material can be deposited at a low temperature, for example, by a known method, such as a vacuum vapor deposition method, an ion-plating method, sputtering, inkjet printing, sol-gel, from a dispersion, etc. For example, sputtering is typically performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

In certain embodiments, the inorganic material comprises a metal chalcogenide. In certain embodiments, the inorganic material comprises a metal sulfide. In certain preferred embodiments, the inorganic material comprises a metal oxide. In certain embodiments, the inorganic material comprises titanium dioxide. In certain more preferred embodiments, the inorganic material comprises zinc oxide. In certain embodiments, the inorganic material can comprise a mixture of two or more inorganic materials.

Additional information concerning inorganic materials that may be useful for inclusion in an electron transport layer is disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

The surface of the device on which an inorganic semiconductor material is to be formed can be cooled or heated for temperature control during the growth process. The temperature can affect the crystallinity of the deposited material as well as how it interacts with the surface it is being deposited upon. The deposited material can be polycrystalline or amorphous. The deposited material can have crystalline domains with a size in the range of 10 Angstroms to 1 micrometer. If doped, the doping concentration can be controlled by, for example, varying the gas, or mixture of gases, with a sputtering plasma technique. The nature and extent of doping can influence the conductivity of the deposited film, as well as its ability to optically quench neighboring excitons.

The layer 4 includes quantum dots. In certain embodiments, the quantum dots comprise an inorganic semiconductor material. In certain preferred embodiments, the quantum dots comprise crystalline inorganic semiconductor material (also referred to as semiconductor nanocrystals). Examples of preferred inorganic semiconductor materials include, but are not limited to, Group II-VI compound semiconductor nanocrystals, such as CdS, CdSe, ZnS, ZnSe, ZnTe, HgS, HgSe, HgTe, and other binary, ternary, and quaternary II-VI compositions; Group III-V compound semiconductor nanocrystals, such as GaP, GaAs, InP and InAs; PbS; PbSe; PbTe, and other binary, ternary, and quaternary III-V compositions. Other non-limiting examples of inorganic semiconductor materials include Group II-V compounds, Group compounds, Group IV-VI compounds, Group I-III-VI compounds, Group II-IV-VI compounds, Group II-IV-V compounds, Group IV elements, an alloy including any of the foregoing, and/or a mixture including any of the foregoing.

Further, as discussed above, quantum dots included in certain aspects and embodiments of the inventions include a core comprising a first semiconductor material and an outer shell surrounding the core, the shell comprising a second semiconductor material, wherein the first semiconductor material confines holes better than electrons in the core and the second semiconductor material is permeable to electrons.

In one example, the first semiconductor material can comprise CdSe and the second semiconductor material can comprise CdS.

In certain embodiments, the second semiconductor material is more permeable to electrons than holes.

By being more permeable to electrons than holes, the second semiconductor material provides a lower barrier for electron tunneling than holes.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level eV. In certain of such embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

For example, a preferred core-shell structured quantum dot comprises a core comprising CdSe and a shell comprising CdS that surrounds the core.

Quantum dots can also have various shapes, including, but not limited to, sphere, rod, disk, other shapes, and mixtures of various shaped particles.

The layer including quantum dots can comprise one or more different types of quantum dots. The difference types can be based, for example, on different composition, different size, different structure, or other distinguishing characteristic or property.

In a device taught herein that comprises a light-emitting device, the color of the light output of a light-emitting device can be controlled by the selection of the composition, structure, and size of the quantum dots included in a light-emitting device as the emissive material.

The layer including quantum dots can comprise one or more layers of the same or different types of quantum dots. In certain embodiments, the layer can have a thickness in a range from about 1 nm to about 40 nm. In certain embodiments, the layer can have a thickness in a range from about 1 nm to about 30 nm. In certain embodiments, the layer can have a thickness in a range from about 1 nm to about 20 nm. In certain embodiments, the layer can have a thickness in a range from about 1 nm to about 10 nm. In certain embodiments, the layer can have a thickness in a range from about 3 nm to about 6 about nm. In certain embodiments, the layer can have a thickness of about 4 nm. In certain embodiments, the layer can comprise a monolayer of quantum dots.

In certain embodiments, different types of quantum dots emit light having a peak emission wavelength that is distinct from that of another type of quantum dot included in the device.

As described above, a layer can comprise a one type of quantum dot or a mixture of different types of quantum dots.

As also described above, more than one layer of quantum dots can be included in a device. In embodiments including more than one layer of quantum dots, a layer can include one type of quantum dot or a mixture of different types of quantum dots. When more than one layer is included, a layer can have a composition that is the same as, or different composition from, that any one or more of any other layers. Even when the compositions of two layers are different, they may include one or more common ingredients.

A thickness of 4 nm can be preferred in a device including an electron transport material including a metal oxide.

In any of the devices described herein that further include a layer comprising a material capable of transporting electrons disposed between the layer comprising quantum dots and the electron injection and transport layer, the absolute value of the difference between $E_{LUMO}$ of the quantum dots and $E_{conduction\ band\ edge}$ of material capable of electrons, can be less than about 0.5 eV. In certain embodiments, the absolute value of the difference between $E_{LUMO}$ of the quantum dots and $E_{conduction\ band\ edge}$ of the material capable of transporting electrons, can be less than about 0.3 eV, less than about 0.2 eV, less than about 0.1 eV, can be about zero. $E_{LUMO}$ of the quantum dots represents the energy level of the lowest unoccupied molecular orbital (LUMO) of the quantum dots; $E_{conduction\ band\ edge}$ of the material capable of transporting electrons represents the energy level of the conduction band edge of the material capable of transporting electrons.

In any of the devices described herein that further include a layer comprising a material capable of transporting electrons (also referred to herein as an electron transport layer) disposed between the layer comprising quantum dots and the electron injection and transport layer, the layer can comprise an inorganic semiconductor material with a composition that can be the same as or different from the inorganic semiconductor material included in the layer comprising a material capable of injection and transporting electrons.

An electron transport layer comprising an inorganic semiconductor material can be formed by a sol-gel technique, can be a nanocrystalline material deposited by vapor/evaporation techniques, or can be a nanoparticle form of the inorganic semiconductor material that is formed from a dispersion of the nanoparticles in a evaporable or volatalizable liquid. Such nanocrystalline material or nanoparticles can have an average grain size or average particle size less than 20 nm. For example, the average grain size or particle size can be less than 10 nm, less than 5 nm, less than 4 nm, less than 2 mm. In certain embodiments, the nanoparticles can have an average particle size in a range from about 2 to about 6 nm. Other sizes may also be determined by the skilled art to be useful and/or desirable. In certain embodiments, a uniform or substantially uniform nanoparticle size may be desirable. In certain embodiments, a nonuniform nanoparticle size may be desirable.

Figure 7:
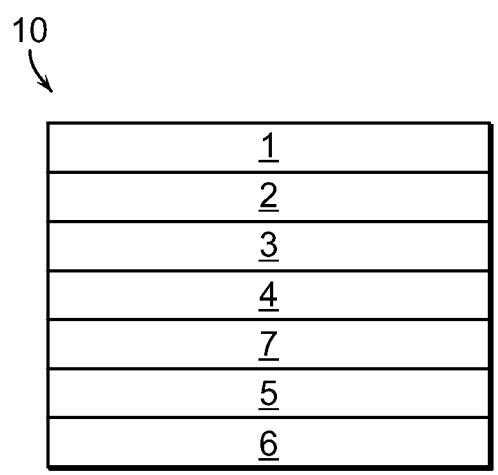
FIG. 7 is schematic drawing depicting an example of an embodiment of a light-emitting device structure in accordance with the invention.

FIG. 7 provides a schematic representation of an example of the architecture of a device according to one embodiment of the present invention. Referring to FIG. 7, the device 10 includes (from top to bottom) an anode 1, a layer comprising a hole injection material 2, a layer comprising a material capable of transporting holes (also referred to herein as a "hole transport layer") 3, a layer including quantum dots 4, a layer comprising a material capable of transporting electrons 7; a layer comprising a material capable of transporting and injecting electrons (also referred to herein as an "electron injection and transport layer") comprising a nanoparticles of an inorganic semiconductor material 5, a cathode 6, and a substrate (not shown).

Quantum dots can include one or more ligands attached to the surface thereof. In certain embodiments, a ligand can include an alkyl (e.g., $C_1$-$C_{20}$) species. In certain embodiments, an alkyl species can be straight-chain, branched, or cyclic. In certain embodiments, an alkyl species can be substituted or unsubstituted. In certain embodiments, an alkyl species can include a hetero-atom in the chain or cyclic species. In certain embodiments, a ligand can include an aromatic species. In certain embodiments, an aromatic species can be substituted or unsubstituted. In certain embodiments, an aromatic species can include a hetero-atom. Additional information concerning ligands is provided herein and in various of the below-listed documents which are incorporated herein by reference.

An example of a preferred quantum dot includes a CdSe core with a surrounding shell comprising CdS and including a ligand set including octadecyl phosphonic acid and decyl amine.

Quantum dots can be deposited by spin-casting, screen-printing, inkjet printing, gravure printing, roll coating, drop-casting, Langmuir-Blodgett techniques, contact printing or other techniques known or readily identified by one skilled in the relevant art.

In certain embodiments, a layer comprising a spacer material (not shown) can be included between the layer comprising quantum dots and a layer of the device adjacent thereto, for example, an electron transport layer and/or a hole transport layer. A layer comprising a spacer material can promote better electrical interface between the emissive layer and the adjacent charge transport layer. A spacer material may comprise an organic material or an inorganic material. In certain embodiments, a spacer material comprises parylene. A spacer material can comprise an ambipolar material. More preferably, it is non-quenching. In certain embodiments, for example, a spacer material between the layer comprising quantum dots and a hole transport layer can comprise an ambipolar host or hole transport material, or nanoparticles such as nickel oxide, and other metal oxides.

Examples of hole transport materials 3 include organic material and inorganic materials. An example of an organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include (N,N'-bis(3-methylphenyl)-N,N'-bis(phenyl)-spiro (spiro-TPD), biphenyl (CBP), 4,4-. bis[N-(1-naphthyl)-N-phenylamino]biphenyl (NPD), etc., a polyaniline, a polypyrrole, a poly (phenylene vinylene), copper phthalocyanine, an aromatic tertiary amine or polynuclear aromatic tertiary amine, a 4,4'-bis(p-carbazolyl)-1,1'-biphenyl compound, N,N,N',N'-tetraarylbenzidine, poly(3,4-ethylenedioxythiophene) (PEDOT)/polystyrene para-sulfonate (PSS) derivatives, poly-N-vinylcarbazole derivatives, polyphenylenevinylene derivatives, polyparaphenylene derivatives, polymethacrylate derivatives, poly(9,9-octylfluorene) derivatives, poly (spiro-fluorene) derivatives, N,N'-di(naphthalene-1-yl)-N, N'-diphenyl-benzidine (NPB), tris(3-methylphenylphenylamino)-triphenylamine (m-MTDATA), and poly(9,9'-dioctylfluorene-co-N-(4-butylphenyl)diphenylamine (TFB), and spiro-NPB (s-NPB).

In certain preferred embodiments, a hole transport layer comprises an organic small molecule material, a polymer, a spiro-compound (e.g., spiro-NPB), etc.

In certain embodiments of the inventions described herein, a hole transport layer can comprise an inorganic material. Examples of inorganic materials include, for example, inorganic semiconductor materials capable of transporting holes. The inorganic material can be amorphous or polycrystalline. Examples of such inorganic materials and other information related to fabrication of inorganic hole transport materials that may be helpful are disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

Hole transport materials comprising, for example, an inorganic material such as an inorganic semiconductor material, can be deposited at a low temperature, for example, by a known method, such as a vacuum vapor deposition method, an ion-plating method, sputtering, inkjet printing, sol-gel, etc.

Organic hole transport materials may be deposited by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr).

Hole transport materials comprising organic materials and other information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, each of which is hereby incorporated herein by reference in its entirety.

The hole transport material is preferably included in the device as a layer. In certain embodiments, the layer can have a thickness in a range from about 10 nm to about 500 nm.

Device 10 includes a hole-injection material 2. The hole-injection material may comprise a separate hole injection material or may comprise an upper portion of the hole transport layer that has been doped, preferably p-type doped. The hole-injection material can be inorganic or organic. Examples of organic hole injection materials include, but are not limited to, LG-101 (see, for example, paragraph [0024] of EP 1 843 411 A1) and other HIL materials available from LG Chem, LTD. Other organic hole injection materials can be used. Examples of p-type dopants include, but are not limited to, stable, acceptor-type organic molecular material, which can lead to an increased hole conductivity in the doped layer, in comparison with a non-doped layer. In certain embodiments, a dopant comprising an organic molecular material can have a high molecular mass, such as, for example, at least 300 amu. Examples of dopants include, without limitation, $F_4$-TCNQ, $FeCl_3$, etc. Examples of doped organic materials for use as a hole injection material include, but are not limited to, an evaporated hole transport material comprising, e.g., 4, 4', 4"-tris (diphenylamino) triphenylamine (TDATA) that is doped with tetrafluoro-tetracyano-quinodimethane ($F_4$-TCNQ); p-doped phthalocyanine (e.g., zinc-phthalocyanine (ZnPc) doped with $F_4$-TCNQ (at, for instance, a molar doping ratio of approximately 1:30); N,N'-diphenyl-N,N'-bis(1-naphthyl)-1,1' biphenyl-4,4"diamine (alpha-NPD) doped with $F_4$-TCNQ. See J. Blochwitz, et al., "Interface Electronic Structure Of Organic Semiconductors With Controlled Doping Levels", *Organic Electronics* 2 (2001) 97-104; R. Schmechel, 48, Internationales Wissenschaftliches Kolloquium, Technische Universtaat Ilmenau, 22-25 Sep. 2003; C. Chan et al., "Contact Potential Difference Measurements Of Doped Organic Molecular Thin Films", *J. Vac. Sci. Technol.* A 22(4), July/August 2004. The disclosures of the foregoing papers are hereby incorporated herein by reference in their entireties. See also, Examples of p-type doped inorganic hole transport materials are described in U.S. Patent Application No. 60/653,094 entitled "Light Emitting Device Including Semiconductor Nanocrystals, filed 16 Feb. 2005, which is hereby incorporated herein by reference in its entirety. Examples of p-type doped organic hole transport materials are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

As shown in FIG. 1, anode 1 may comprise an electrically conductive metal or its oxide that can easily inject holes. Examples include, but are not limited to, ITO, aluminum, aluminum-doped zinc oxide (AZO), silver, gold, etc. Other suitable anode materials are known and can be readily ascertained by the skilled artisan. The anode material can be deposited using any suitable technique. In certain embodiments, the anode can be patterned.

In certain embodiments, the device may be fabricated by sequentially forming the cathode 6, the electron transport and injection layer 5, the layer comprising quantum dots 4, the hole transport layer 3, and the anode 2. This sequential approach avoids the deposition of the layer comprising quantum dots directly onto an organic material.

In certain embodiments, the electrode (e.g., anode or cathode) materials and other materials are selected based on the light transparency characteristics. For a device comprising a light-emitting device, such selection can enable preparation of a device that emits light from the top surface thereof. A top emitting device can be advantageous for constructing an active matrix device (e.g., a display). In certain embodiments, the electrode (e.g., anode or cathode) materials and other materials are selected based on light transparency characteristics thereof so that a device can be prepared that emits light from the bottom surface thereof. In certain embodiments, the electrode (e.g., anode or cathode) materials and other materials are selected based on light transparency characteristics thereof so that a device can be prepared that is transparent.

As mentioned above, the device can further include a substrate (not shown in the figure). Examples of substrate materials include, without limitation, glass, plastic, insulated metal foil.

In certain embodiments, a device can further include a passivation or other protective layer that can be used to protect the device from the environment. For example, a protective glass layer can be included to encapsulate the device. Optionally a desiccant or other moisture absorptive material can be included in the device before it is sealed, e.g., with an epoxy, such as a UV curable epoxy. Other desiccants or moisture absorptive materials can be used.

During fabrication of the device structure, after quantum dots are disposed over the underlying device layer, the quantum dots may optionally be treated with small molecules (e.g., water vapor) and/or light flux, as described in International Patent Application No. PCT/US2010/56397 of QD Vision, Inc. filed 11 Nov. 2010, entitled "Device Including Quantum Dots", which is hereby incorporated herein by reference in its entirety. Each of U.S. Application No. 61/260,388 filed 11 Nov. 2009; U.S. Application No. 61/262,501 filed 18 Nov. 2009; U.S. Application No. 61/377,242 filed 26 Aug. 2010; U.S. Application No. 61/377,125 filed 26 Aug. 2010; and U.S. Application No. 61/377,148 filed 26 Aug. 2010, from which International Patent Application No. PCT/US2010/56397 claims priority, is also incorporated herein by reference in its entirety.

A device in accordance with the present invention can further optionally include one or more interfacial layers as also described in above-referenced International Application No. PCT/US2010/051867.

A quantum dot is a nanometer sized particle that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety.

A quantum dot can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

For convenience, the size of quantum dots can be described in terms of a "diameter". In the case of spherically shaped quantum dots, diameter is used as is commonly understood. For non-spherical quantum dots, the term diameter can typically refer to a radius of revolution (e.g., a smallest radius of revolution) in which the entire non-spherical quantum dot would fit.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

In certain preferred embodiments, the quantum dots comprise crystalline inorganic semiconductor material (also referred to as semiconductor nanocrystals). Examples of preferred inorganic semiconductor materials include, but are not limited to, Group II-VI compound semiconductor nanocrystals, such as CdS, CdSe, ZnS, ZnSe, ZnTe, HgS, HgSe, HgTe, and other binary, ternary, and quaternary II-VI compositions; Group III-V compound semiconductor nanocrystals, such as GaP, GaAs, InP and InAs; PbS; PbSe; PbTe, and other binary, ternary, and quaternary III-V compositions. Other non-limiting examples of inorganic semiconductor materials include Group II-V compounds, Group III-VI compounds, Group IV-VI compounds, Group compounds, Group II-IV-VI compounds, Group II-IV-V compounds, Group IV elements, an alloy including any of the foregoing, and/or a mixture including any of the foregoing.

A quantum dot can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, more than one shell or overcoating can be included in a quantum dot.

In certain embodiments, the shell can be chosen so as to have an atomic spacing close to that of the "core" substrate. In certain other embodiments, the shell and core materials can have the same crystal structure.

In certain embodiments, the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV. In certain of such embodiments, the difference between $E_{conduction\ band\ edge}$ of the first semiconductor material included in the quantum dot core and $E_{conduction\ band\ edge}$ of the second semiconductor material included in the outer shell of the quantum dot is less than 0.3 eV, less than 0.2 eV, less than 0.1 eV, or less than 0.05 eV.

Quantum dots can also have various shapes, including, but not limited to, sphere, rod, disk, other shapes, and mixtures of various shaped particles.

The quantum dots are typically colloidally grown and include one or more ligands attached to the surface thereof. In certain embodiments, a ligand can include an alkyl (e.g., $C_1$-$C_{20}$) species. In certain embodiments, an alkyl species can be straight-chain, branched, or cyclic. In certain embodiments, an alkyl species can be substituted or unsubstituted. In certain embodiments, an alkyl species can include a hetero-atom in the chain or cyclic species. In certain embodiments, a ligand can include an aromatic species. In certain embodiments, an aromatic species can be substituted or unsubstituted. In certain embodiments, an aromatic species can include a hetero-atom. Additional information concerning ligands is provided.

By controlling the structure, shape and size of quantum dots during preparation, energy levels over a very broad range of wavelengths can be obtained while the properties of the bulky materials are varied.

Quantum dots (including but not limited to semiconductor nanocrystals) can be prepared by known techniques. Preferably they are prepared by a wet chemistry technique wherein a precursor material is added to a coordinating or non-coordinating solvent (typically organic) and nanocrystals are grown so as to have an intended size. According to the wet chemistry technique, when a coordinating solvent is used, as the quantum dots are grown, the organic solvent is naturally coordinated to the surface of the quantum dots, acting as a dispersant. Accordingly, the organic solvent allows the quantum dots to grow to the nanometer-scale level. The wet chemistry technique has an advantage in that quantum dots of a variety of sizes can be uniformly prepared by appropriately controlling the concentration of precursors used, the kind of organic solvents, and preparation temperature and time, etc.

A coordinating solvent can help control the growth of quantum dots. The coordinating solvent is a compound having a donor lone pair that, for example, has a lone electron pair available to coordinate to a surface of the growing quantum dots. Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for quantum dot production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutylphosphite, tributyl phosphite, trioctadecyl phosphite, trilauryl phosphite, tris(tridecyl)phosphite, triisodecyl phosphite, bis(2-ethylhexyl)phosphate, tris(tridecyl)phosphate, hexadecylamine, oleylamine, octadecylamine, bis(2-ethylhexyl) amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Quantum dots can alternatively be prepared with use of non-coordinating solvent(s).

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of quantum dots can be further refined by size selective precipitation with a poor solvent for the quantum dots, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot population preferably has no more than a 15% rms deviation from mean diameter, more preferably 10% rms deviation or less, and most preferably 5% rms deviation or less.

In certain embodiment, the ligands can be derived from the coordinating solvent used during the growth process.

In certain embodiments, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

A suitable coordinating ligand can be purchased commercially or prepared by ordinary synthetic organic techniques, for example, as described in J. March, Advanced Organic Chemistry.

Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated herein by reference in its entirety.

Other examples of ligands include benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, or a mixture of the foregoing. In certain embodiments, a ligand comprises 3,5-di-tort-butyl-4-hydroxybenzylphosphonic acid, a conjugate base of the acid, or a mixture of the foregoing.

Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", each of the foregoing being hereby incorporated herein by reference.

The emission from a quantum dot capable of emitting light (e.g., a semiconductor nanocrystal) can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light (e.g., semiconductor nanocrystals) can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, no greater than about 60 nm, no greater than about 40 nm, and no greater than about 30 nm full width at half max (FWHM) for such quantum dots that emit in the visible can be observed. IR-emitting quantum dots can have FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Quantum dots that can be included in a device taught herein can include one or more different types of quantum dots, wherein each type can be selected to emit light having a predetermined wavelength. In certain embodiments, quantum dot types can be different based on, for example, factors such composition, structure and/or size of the quantum dot.

Quantum dots can be selected to emit at any predetermined wavelength across the electromagnetic spectrum.

Different types of quantum dots that have emissions at the same and/or different wavelengths can be utilized.

In certain embodiments, quantum dots can be capable of emitting visible light.

In certain embodiments, quantum dots can be capable of emitting infrared light.

As used herein, $E_{LUMO}$ of the quantum dots represents the energy level of the lowest unoccupied molecular orbital (LUMO) of the quantum dot.

As used herein, $E_{conduction\ band\ edge}$ represents the energy level of the conduction band edge of the particular material to which it refers.

As used herein, $E_{valence\ band\ edge}$ represents the energy level of the valence band edge of the particular material to which it refers.

The present invention will be further clarified by the following non-limiting examples, which are intended to be exemplary of the present invention.

EXAMPLES

Example 1

Preparation of Quantum Dots Capable of Emitting Red Light with a CdS Shell

Synthesis of CdSe Cores:

26.23 mmol cadmium acetate was dissolved in 235.4 mmol of tri-n-octylphosphine at 100° C. in a 250 mL 3-neck round-bottom flask and then dried and degassed for one hour. 465.5 mmol of trioctylphosphine oxide and 59.8 mmol of octadecylphosphonic acid were added to a 0.5 L stainless steel reactor and dried and degassed at 140° C. for one hour. After degassing, the Cd solution was added to the reactor containing the oxide/acid and the mixture was heated to 298° C. under nitrogen. Once the temperature reached 298° C., 425 mmol of aerated tri-n-butylphosphine (see preparation below) was injected into the flask. The temperature of the mixture was then raised to 305° C. where 105 mL of 1.5 M aerated TBP—Se (see preparation below) was then rapidly injected. The reaction was allowed to proceed for 13 minutes (aliquots taken at 1 minute intervals to observe the growth and corresponding absorption wavelength shift) at which point the reactor was then immediately submerged in partially frozen (via liquid nitrogen) squalane bath rapidly reducing the temperature of the reaction to below 100° C. The first absorption peak of the nanocrystals was 561 nm. The CdSe cores were precipitated out of the growth solution inside a nitrogen atmosphere glovebox by adding a 3:1 mixture of methanol and isopropanol. The isolated cores (abs=557 nm) were then dissolved in hexane and used to make core-shell materials.

Preparation of Aerated TBP—Se:

9.5 mol of TBP (Strem Lot A4329040) was loaded into a 3 L 3-neck round-bottom flask. A tank of dry compressed air was used to bubble dry air into the TBP at a rate of 4 L per minute. The temperature of the TBP was monitored during the aeration process.

| Elapsed Time (min) | Temperature (° C.) |
|---|---|
| 0 | 22.8 |
| 14 | 30.7 |
| 58 | 43.1 |
| 80 | 47.1 |
| 108 | 54.9 |
| 188 | 79.5 |

This aerated TBP was then combined with pure TBP (Strem 99%) in a ratio of 1:3 and then used as aerated TBP. The TBP—Se was made by mixing 105 mL of aerated TBP with 13.03 g of Se shot generating 1.5 M TBP—Se used in the core preparation above.

Synthesis of CdSe/CdS Core-Shell Nanocrystals:

517.3 mmol of trioctylphosphine oxide and 48.3 mmol of Octadecylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (1.98 mmol Cd content) was added to the reaction mixture. The hexane was removed under reduced pressure followed by the addition of 85.33 mmol of decylamine. Dimethyl cadmium and hexamethyldisilathiane were used as the Cd and S precursors, respectively. The Cd and S were mixed in equimolar ratios. The Cd (10.37 mmol of dimethylcadmium) and S (1037 mmol of hexamethyldisilathiane) samples were each dissolved in 40 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump. After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in hexane and precipitated a second time by adding a 3:1 mixture of methanol and isopropanol. The isolated core-shell nanocrystals were then dissolved in hexane and used to make QLEDs. The material specifications were as follows: Abs=605 nm; Emission=619 nm; FWHM=30 nm; QY=81% in Hexane Example 2

Fabrication of Device including Quantum Dots with CdS Shell and Electron Transport & Injection Layer prepared from ZnO Nanoparticles QLED Device Fabrication:
Preparation of a Dispersion Including Zno Particles for Use in Preparing an Electron Injection and Transport Layer:

A dispersion including ZnO nanoparticles for use in preparing an electron injection and transport layer is prepared as follows. 1.5 g of zinc acetate dehydrate is dissolved into 200 ml of ethanol at room temperature under stirring. To this, 3 ml of an organic base solution (3.6 g tetramethylammonium hydroxide in 10 ml methanol) is added drop-wise. After addition of the base, the solution is stirred for a further 20 minutes to ensure complete particle formation. Stock solution should be stored in a refrigerator to ensure nanoparticle stability. 10 ml of ZnO nanoparticle solution is taken out and precipitated with 30 ml of hexane. The solution is then spun at 2500 rpm for 2 minutes in a centrifuge and the supernatant is removed before drying under dry nitrogen flow. The ZnO nanoparticles are then re-dispersed into 0.75 ml IPA. Final concentration of ZnO nanoparticles in the dispersion should be approximately 50 mg/ml.

QLED Fabrication:

Quantum dot light emitting devices are made as follows. Glass (50 mm×50 mm) with patterned indium tin oxide (ITO) electrodes on one surface is cleaned ultrasonically using sequential de-ionized water, acetone and isopropanol (IPA) baths followed by cleaning with an oxygen plasma for 6 minutes to remove contaminants. An electron injection and electron transport layer is prepared from a ZnO nanoparticle dispersion prepared generally as described above. The ZnO nanoparticle dispersion is spin coated at 2000 rpm onto the ITO. The film is then baked in a vacuum oven at 80° C. for 10 minutes to remove remaining solvent. The thickness of ZnO film is approximately around 40 nm. The substrate is then transferred into nitrogen-filled glove box, which normally has oxygen and water levels below 1 ppm. A coating formulation including quantum dots in hexane (prepared generally in accordance with the procedure of Example 1) is spin coated on the ZnO surface at 2000 rpm for about 30 seconds. The target thickness of quantum dot film is about 30 to 40 nm. The quantum dot film is then baked at 80° C. for 30 minutes in a vacuum oven to remove the solvent. Then all samples are transferred to a vacuum deposition chamber and pumped down to $10^{-7}$ torr for evaporation of subsequent device layers. A 65 nm layer of hole transport material (s-2NPB, OLED grade, available from Luminescent Technologies (LumTec), Taiwan) is then evaporated onto the emissive layer in a deposition chamber, followed by a 15 nm hole injection layer (LG-101 OLED grade, available from LG Chem, LTD). Finally a 100 nm Al anode is deposited to complete the device. The package is then sealed in an $N_2$ environment using a UV epoxy.

Figure 3:
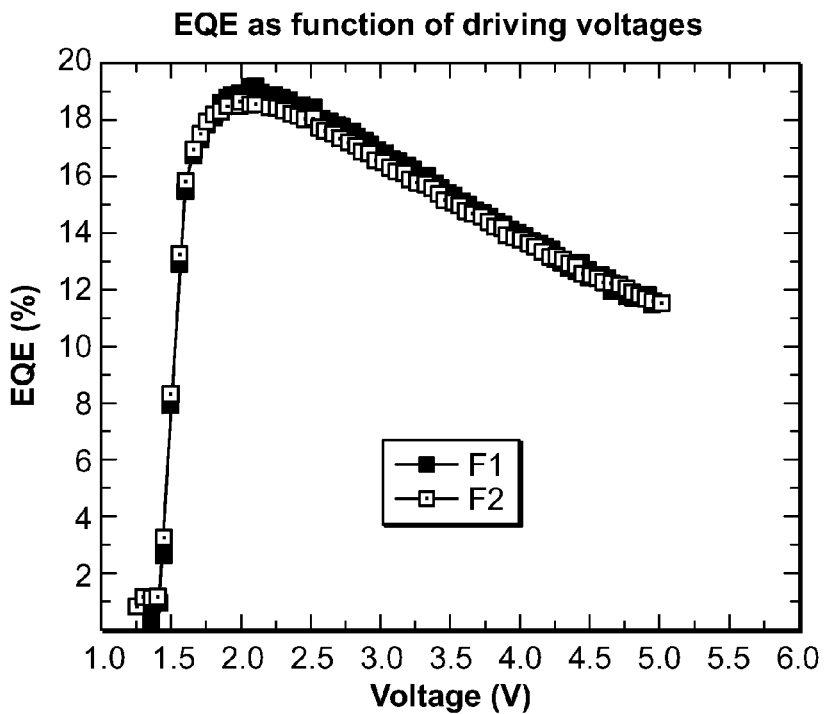
FIG. 3 graphically illustrates EQE as a function of driving voltages for an example of light-emitting device in accordance with one aspect of the invention.
Figure 4:
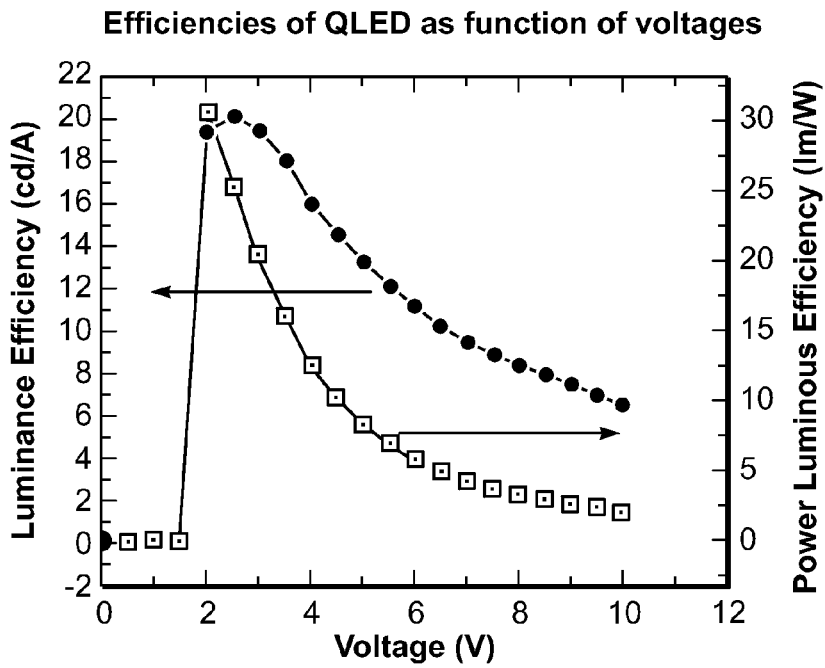
FIG. 4 graphically illustrates efficiencies EQE as a function of driving voltages for an example of light-emitting device in accordance with one aspect of the invention.
Figure 5:
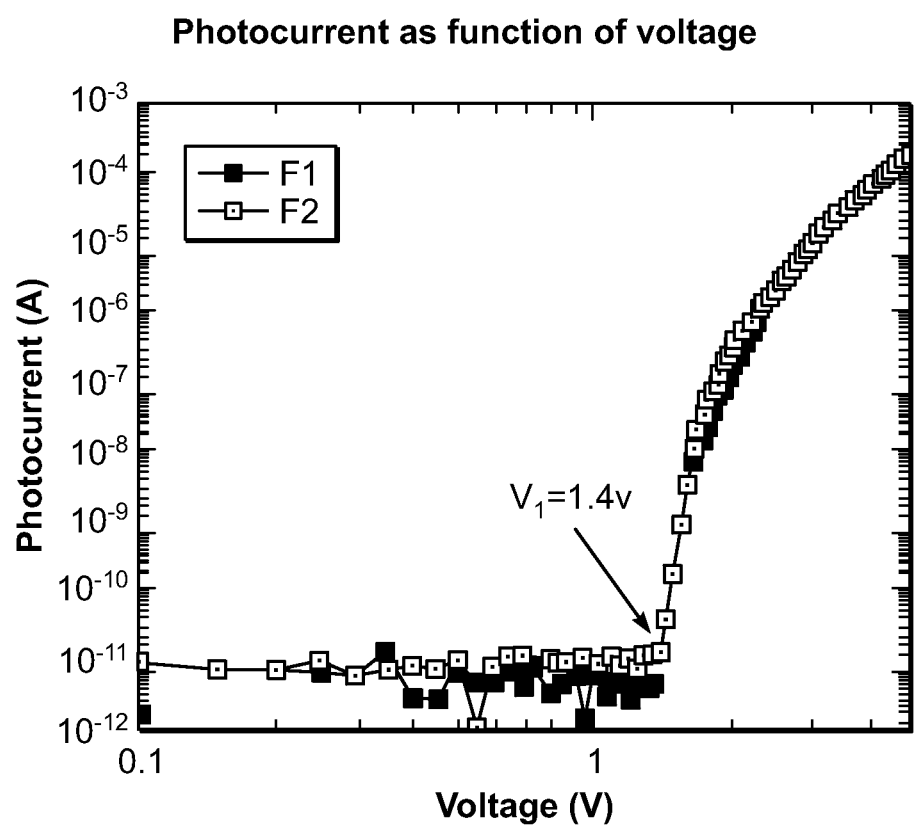
FIG. 5 graphically illustrates photocurrent as a function of voltage for an example of light-emitting device in accordance with one aspect of the invention.
Figure 6A:
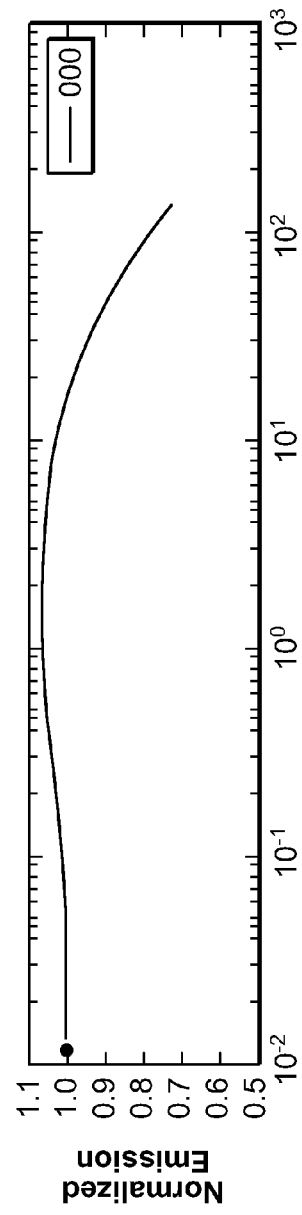
FIG. 6A-6C graphically illustrate electroluminescent lifetime for an example of light-emitting device in accordance with one aspect of the invention.
Figure 6B:
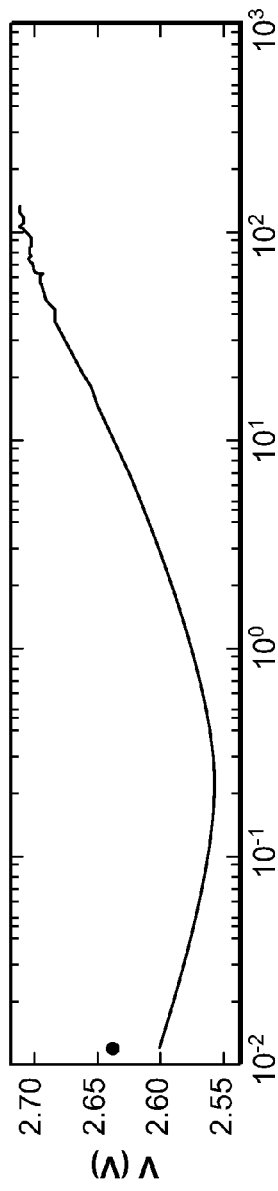
Figure 6C:
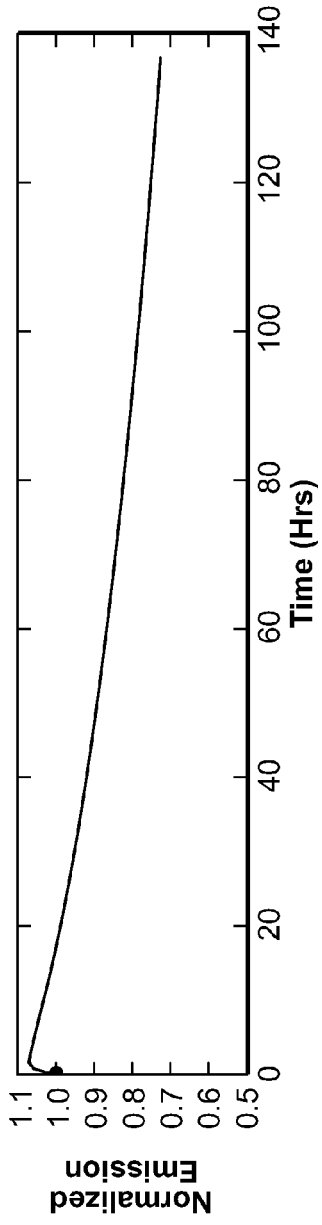

FIGS. 2 through 6C illustrate data for light-emitting devices prepared generally in accordance with the procedure of this Example 2. (Such devices are also referred to in the figures as a CdS QLED, a CdS shell device, or a red QLED.) FIG. 3 graphically shows EQE as a function of driving voltages for devices F1 and F2 when measured over a range from 1 V to 6 V. FIG. 4 graphically shows luminance efficiency (cd/A) as a function of voltage for device F1 (see the curve identified with an arrow pointing left) when measured over a range from 0 V to 12 V and power luminous efficiency (lumens/Watt) a function of voltage for device F1 (see the curve identified with an arrow pointing right) when measured over a range from 0 V to 12 V. FIG. 5 graphically shows photocurrent (amps) as a function of voltage for devices F1 and F2 when measured over a range from 0.1 V to 5V. FIGS. 6A-6C graphically show EL lifetime data for a third device: FIG. 6A shows normalized emission as a function of time (log scale); FIG. 6B shows voltage (volts) as a function of time (log scale); and FIG. 6C shows normalized emission as a function of time (linear scale).

Example 3

Fabrication of Devices including Two Layers including ZnO Nanoparticles

Glass (50 mm×50 mm) with patterned indium tin oxide (ITO) electrode on one surface (obtained from Osram Malaysia) is cleaned in an oxygen plasma for about 6 minutes to remove contaminants and oxygenate the surface. The cleaning takes place on 100% oxygen at about 20 psi.

The glass is placed on a water cooled plate to help control the increase in temperature during cleaning.

An electron injection and transport layer comprising zinc oxide nanoparticles is prepared as follows.

The cleaned substrates are transferred into a nitrogen filled glove box for all subsequent processing.

A solution of ZnO nanoparticles (either intrinsic or n-doped (e.g., containing an n-type dopant)) suspended in isopropanol is deposited on the cleaned substrate by spin coating at, e.g., 2000 rpm spin speed. The film is then baked in a vacuum oven at 80° C. for 10 minutes to remove remaining solvent. The thickness of the baked film is in the range of 20-40 nm. Upon removal from the oven, the film is exposed to a UV lamp (260 nm emission range) for 2 minutes. The UV step leads to an increase in the carrier density of the ZnO resulting in the formation of ohmic contact between the ITO electrode and the ZnO electron transport layer.

A second layer of ZnO nanoparticles (either intrinsic or n-doped (e.g., containing an n-type dopant)) is then spun on top of the first layer. The resulting film is then baked at 80° C. in a vacuum oven to remove remaining solvent. The thickness of the combined ZnO film is approximately double (40-80 nm) the single layer.

The metal oxide coated glass is then transferred into nitrogen-filled glove box, which normally has oxygen and water levels below 1 ppm. A coating formulation including quantum dots in hexane is spun coated on ZnO surface at, e.g., 3000 rpm for 1 minute. The quantum dot film thickness is optimized by using various optical density solutions. Through the device performance optimization, the thickness of quantum dot film is kept around 25 nm, and is confirmed by atomic force microscopy (AFM).

After the quantum dots are deposited, the device is returned to the deposition chamber and pumped back down to $10^{-6}$ torr or better for evaporation of the next layer.

A 50 nm layer of hole transport material (e.g., N,N'-bis (3-methylphenyl)-N,N'-bis(phenyl)-spiro (spiro-TPD) (OLED grade, gradient sublimation purified) available from Luminescent Technologies (LumTec), Taiwan)) is then evaporated onto the emissive layer in a deposition chamber (e.g., an AMOD chamber, obtained from Angstrom Engineering, Ottowa, Canada) after the chamber is pumped down to $10^{-6}$ torr or better. The hole transport material is typically OLED grade (e.g., gradient sublimation purified). Such grade materials are commercially available from Luminescent Technologies, Taiwan and other suppliers of OLED grade materials.

A hole injection layer (e.g., 5% F4-TCNQ and E-105) (20 nm) is formed over the hole transport layer by co-evaporation techniques similar to those described above for preparing the hole transport layer. (E105 refers to spiro-TPD available from LumTec.)

Each of the vapor deposited layers is patterned with use of shadow masks. After deposition of the hole transport material layer and hole injection layer, the mask is changed before deposition of a 100 nm Al anode.

Example 4

Procedure for Preparation of n-Doped ZnO Nanoparticles n-doped ZnO nanoparticles can be prepared as follows: 100 ml of 2-methoxyethanol is heated to 50° with stirring. 1.5 g (0.007 mol) of zinc acetate dihydrate is dissolved in the heated 2-methoxyethanol under stirring. To make, for example, 3% Indium-doped ZnO, 0.0002 mol indium chloride tetrahydrate is also added at the same time. To this, an organic base solution (2.3 grams (0.013 mol) of tetramethylammonium hydroxide pentahydrate (TMAH) in 10 ml of 2-methoxyethanol) is added drop-wise (for example, over about 5 minutes). After addition of the base, the solution is stirred for a further 15 minutes to ensure complete particle formation. (Exhibition of a pale blue-green photoluminescence from the solution is an indication of nanoparticle formation.) The stock solution should be stored in a refrigerator to ensure nanoparticle stability. 10 ml of ZnO nanoparticle dispersion was taken out and precipitated with a mixture of 20 ml toluene and 10 ml of hexane. The solution is then spun at 2500 rpm, e.g., for about 1 minute in a centrifuge and the supernatant is removed before drying under dry nitrogen flow. The nanoparticles are then re-dispersed in a mixture of IPA (3.5 ml) and methanol (0.5 ml). The solution is filtered and the end product stored in a refrigerator. This can be used for spin-coating a thick film of n-doped ZnO nanoparticles. (A thick film can typically have thickness of 30-40 nm.) A nanoparticle size in a range of about 3-5 nm is expected.

Light-emitting devices in accordance with various embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

In certain embodiments, a device taught herein can comprise a photovoltaic or photodetector device including a layer comprising quantum dots selected based upon absorption properties.

When included in such types of devices, quantum dots are engineered to produce a predetermined electrical response upon absorption of a particular wavelength, typically in the IR or MIR region of the spectrum.

Other materials, techniques, methods, applications, and information that may be useful with the present invention are described in: International Application No. PCT/US2007/013152, filed Jun. 4, 2007, of Coe-Sullivan, et al., for "Light-Emitting Devices And Displays With Improved Performance"; International Application No. PCT/US2010/056397 of Kazlas, et al., filed 11 Nov. 2010, entitled "Device Including Quantum Dots", and International Application No. PCT/US2008/013504, filed Dec. 8, 2008, entitled "Flexible Devices Including Semiconductor Nanocrystals, Arrays, and Methods", of Kazlas, et al., which published as WO2009/099425 on Aug. 13, 2009, U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", U.S. application Ser. No. 12/283,609, filed 12 Sep. 2008 of Coe-Sullivan, et al., for "Compositions, Optical Component, System Including An Optical Component, Devices, And Other Products", and'International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods, each of the foregoing being hereby incorporated herein by reference in its entirety.

It will be understood that when an element or layer is referred to as being "over" another element or layer, the element or layer can be directly on or connected to another element or layer or there can be intervening elements or layers. As used herein, the term "and/or" includes any and all combinations of one or more of the associated listed items.

It will be understood that, although the terms first, second, third, etc., can be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the exemplary embodiments of the invention.

As used herein, the singular forms "a," "an" and "the" are intended to include the plural forms as well, unless the context clearly indicates otherwise. The terms "comprises" and/or "comprising," or "includes" and/or "including" when used in this specification, specify the presence of stated features, regions, integers, steps, operations, elements and/or components, but do not preclude the presence or addition of one or more other features, regions, integers, steps, operations, elements, components and/or groups thereof.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A light emitting device comprising:
a pair of electrodes comprising an anode and a cathode;
an emissive layer comprising electroluminescent quantum dots disposed between the electrodes, wherein the quantum dots comprise a core comprising a first semiconductor material and an outer shell surrounding the core, the outer shell comprising a second semiconductor material;
a first layer comprising an electron injection and transport material comprising nanoparticles of an n-doped inorganic semiconductor, the first layer being in contact with the cathode and positioned between the emissive layer and the cathode, wherein the n-doped inorganic semiconductor comprises zinc oxide, titanium oxide, or a mixture including at least one of the foregoing that is n-doped, and
a second layer comprising an electron transport material comprising nanoparticles of an inorganic semiconductor, the second layer being disposed between the emissive layer and the first layer, wherein the second layer has a lower electron conductivity than the first layer, and
wherein the device has a peak external quantum efficiency of at least 14% when measured over the voltage range of 1 V to 10 V.

2. A light emitting device in accordance with claim 1 wherein the absolute value of the difference between $E_{conduction\ band\ edge}$ of the inorganic semiconductor material included in the second layer and $E_{LUMO}$ of the quantum dots is no greater than 0.5 eV measured relative to vacuum level with an energy level=0 eV.

3. A light emitting device in accordance with claim 1 wherein the first layer is UV (ultraviolet light) treated.

4. A light emitting device in accordance with claim 1 wherein the first semiconductor material confines holes better than electrons in the core and the second semiconductor material is permeable to electrons.

5. A light emitting device in accordance with claim 1 wherein the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV.

6. A light emitting device in accordance with claim 1 wherein the device has a peak external quantum efficiency in a range from 14% to 19.1% when measured over the voltage range of 1 V to 10 V.

7. A light emitting device in accordance with claim 1 wherein the first layer and the cathode form an ohmic contact during operation of the device.

8. A light emitting device in accordance with claim 1 further including a layer comprising a material capable of transporting holes disposed between the layer comprising quantum dots and the anode.

9. A light emitting device in accordance with claim 1 further including hole injection layer between the layer comprising quantum dots and the anode.

10. A light emitting device in accordance with claim 1 wherein at least a portion of the quantum dots comprise a core comprising a first semiconductor material, a first shell surrounding the core comprising a second semiconductor material, and a second shell comprising a third semiconductor material, the second shell surrounding the first shell.

11. A light emitting device in accordance with claim 1 wherein the device is encapsulated.

12. A light emitting device in accordance with claim 1 wherein the device has a peak internal quantum efficiency of the device of at least about 80%.

13. A light emitting device in accordance with claim 1 wherein the nanoparticles of an n-doped inorganic semiconductor have an average particle size less than 20 nm.

14. A light emitting device in accordance with claim 1 wherein the nanoparticles of an n-doped inorganic semiconductor have an average particle size less than 10 nm.

15. A light emitting device in accordance with claim 1 wherein the nanoparticles of an n-doped inorganic semiconductor have an average particle in a range from about 2 to about 6 nm.

16. A light emitting device in accordance with claim 1 wherein the n-dopant comprises indium, aluminum, or gallium.

17. A light emitting device in accordance with claim 4 wherein the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV.

18. A light emitting device in accordance with claim 4 wherein the first semiconductor material comprises CdSe and the second semiconductor material comprises CdS.

19. A light emitting device in accordance with claim 4 having a peak EQE of at least 18% when measured over a voltage range from 1 Volt to 10 Volts.

20. A light emitting device in accordance with claim 4 having a light turn-on voltage less than 2 Volts.

21. A light emitting device in accordance with claim 4 having a light turn-on voltage less than 1.5 Volts.

22. A light emitting device in accordance with claim 5 wherein the first semiconductor material comprises CdSe and the second semiconductor material comprises CdS.

23. A light emitting device in accordance with claim 5 wherein the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between $E_{valence\ band\ edge}$ of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV.

24. A light emitting device in accordance with claim 10 wherein the first semiconductor material comprises CdSe, the second semiconductor material comprises CdS, and the third semiconductor material comprises ZnS.

25. A light emitting device including an emissive layer comprising electroluminescent quantum dots disposed between an anode and a cathode,
a first layer comprising an electron injection and transport material comprising nanoparticles of a first inorganic semiconductor material, the first layer being disposed between the layer comprising quantum dots and the cathode, wherein the first layer and the cathode form an ohmic contact during operation of the device,
wherein the first inorganic semiconductor material includes at least one of zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, and osmium oxide,
wherein the electroluminescent quantum dots comprise a core comprising a first semiconductor material and an outer shell surrounding the core, the outer shell comprising a second semiconductor material, wherein the absolute value of the difference between $E_{conduction\ band\ edge}$ of the first semiconductor material included in the quantum dot core and $E_{conduction\ band\ edge}$ of the second semiconductor material included in the outer shell of the quantum dot is less than the absolute value of the difference between E valence band edge of the first semiconductor material and $E_{valence\ band\ edge}$ of the second semiconductor material, wherein the differences are calculated based on the $E_{conduction\ band\ edge}$ and $E_{valence\ band\ edge}$ values for bulk forms of the first and second semiconductor materials measured relative to vacuum level with an energy level=0 eV,
wherein the quantum dots emit light when voltage is applied across the anode and cathode, and wherein the device has a peak EQE of at least 18% when measured over a voltage range from 1 V to 10 V.

26. A light-emitting device in accordance with claim 25 wherein the nanoparticles of a first inorganic semiconductor material have an average particle size less than 20 nm.

27. A light-emitting device in accordance with claim 25 wherein the nanoparticles of a first inorganic semiconductor material have an average particle size less than 10 nm.

28. A light-emitting device in accordance with claim 25 wherein the nanoparticles of a first inorganic semiconductor material have an average particle in a range from about 2 to about 6 nm.

* * * * *